United States Patent [19]

Tsang et al.

[11] Patent Number: 6,011,497

[45] Date of Patent: Jan. 4, 2000

[54] LOCATION DEPENDENT MAXIMUM TRANSITION RUN LENGTH CODE WITH ALTERNATING CODE WORD LENGTH AND EFFICIENT K CONSTRAINT

[75] Inventors: Kinhing P. Tsang, Plymouth; Bernardo Rub, Edina, both of Minn.

[73] Assignee: Seagate Technology, Inc., Scotts Valley, Calif.

[21] Appl. No.: 09/052,582

[22] Filed: Mar. 31, 1998

Related U.S. Application Data

[60] Provisional application No. 60/075,723, Feb. 24, 1998, and provisional application No. 60/042,518, Apr. 1, 1997.

[51] Int. Cl.[7] .................................................. H03M 7/46
[52] U.S. Cl. .............................................. 341/59; 341/50
[58] Field of Search .................................. 341/59, 58, 50, 341/68, 69, 70, 71, 72, 73

[56] References Cited

U.S. PATENT DOCUMENTS

| | | | |
|---|---|---|---|
| 5,341,386 | 8/1994 | Shimoda et al. | 371/43 |
| 5,451,943 | 9/1995 | Satomura | 341/58 |
| 5,502,735 | 3/1996 | Cooper | 371/43 |
| 5,553,169 | 9/1996 | Mizuoka | 382/282 |
| 5,576,707 | 11/1996 | Zook | 341/58 |
| 5,731,768 | 3/1998 | Tsang | 341/59 |
| 5,859,601 | 1/1999 | Moon et al. | 341/59 |

OTHER PUBLICATIONS

B. Brickner and J. Moon, "A High–Dimensional Signal Space Implementation of FDTS/DF", *IEEE Transactions on Magnetics*, Sep. 1996, pp. 3941–3943.

B. Brickner and J. Moon, "Maximum Transition Run Codes for Data Storage Systems", *IEEE Transaction on Magnetics*, Sep. 1996, pp. 3992–3994.

*Primary Examiner*—Brian Young
*Attorney, Agent, or Firm*—Westman, Champlin & Kelly, P.A.

[57] ABSTRACT

An encoder and a method of encoding successive data words into successive code words having alternating code word lengths. Each code word has a plurality of bit locations. A first maximum transition run constraint is imposed on a first set of the bit locations, wherein each bit location in the first set is spaced S bit locations apart from one another, and S is an integer greater than one. A second maximum transition run constraint, which is different than the first maximum transition run constrain, is imposed on a second set of the bit locations, wherein the second set comprises each of the bit locations that are not in the first set. The alternating code word lengths and the value of S are defined such that corresponding bit locations in successive code words have the same maximum transition run constraint.

16 Claims, 4 Drawing Sheets

FIG. 3

Section 180:

| 190 | 2 | 3 | 2 | 3 | 2 | 3 | 2 | 3 |
|---|---|---|---|---|---|---|---|---|
| 188 | O | E | O | E | O | E | O | E |
| 186 | 1 | 2 | 3 | 4 | 5 | 6 | 7 | 8 |
| 184 | 7 | 6 | 5 | 4 | 3 | 2 | 1 | 0 |
| 178 | 0 | 0 | 0 | 0 | 0 | 0 | 0 | 1 |
| 200 |   |   |   | 8 |   |   |   | 1 |
| 202 |   |   |   | S |   |   |   | 0 |
| 204 |   |   |   | 0 |   |   |   | 0 |

Section 181:

| 190 | 2 | 3 | 2 | 3 | 2 | 3 | 2 | 3 | 2 | 3 |
|---|---|---|---|---|---|---|---|---|---|---|
| 188 | O | E | O | E | O | E | O | E | O | E |
| 186 | 9 | 10 | 11 | 12 | 13 | 14 | 15 | 16 | 17 | 18 |
| 184 | 9 | 8 | 7 | 6 | 5 | 4 | 3 | 2 | 1 | 0 |
| 178 | 1 | 1 | 0 | 1 | 0 | 0 | 1 | 0 | 1 | 0 |
| 200 |   |   |   | 3 |   | 4 A |   |   |   |   |
| 202 |   |   |   | S |   | S 2 |   |   |   |   |
| 204 |   |   |   | D |   | D 5 |   |   |   |   |

Section 182:

| 190 | 2 | 3 | 2 | 3 | 2 | 3 | 2 | 3 | 2 | 3 |
|---|---|---|---|---|---|---|---|---|---|---|
| 188 | O | E | O | E | O | E | O | E | O | E |
| 186 | 19 | 20 | 21 | 22 | 23 | 24 | 25 | 26 |   |   |
| 184 | 7 | 6 | 5 | 4 | 3 | 2 | 1 | 0 |   |   |
| 178 | 1 | 1 | 0 | 1 | 1 | 0 | 0 | 0 |   |   |
| 200 |   |   |   | D |   |   |   |   |   |   |
| 202 |   |   |   | 8 |   |   |   |   |   |   |
| 204 |   |   |   | S |   |   |   |   |   |   |
| 204 |   |   |   | 0 |   |   |   |   |   |   |

Pointers: 190, 188, 186, 184, 178, 200, 202, 204

FIG. 6

Section 180 (260 "Y"):

| 264 | M | N | M | N | M | N | M | N |
|---|---|---|---|---|---|---|---|---|
| 184 | 7 | 6 | 5 | 4 | 3 | 2 | 1 | 0 |
| 178 | 0 | 0 | 0 | 0 | 0 | 0 | 0 | 1 |

266 ("S")

Section 181 (262 "Z"):

| M | N | M | N | M | N | M | N | M | N |
|---|---|---|---|---|---|---|---|---|---|
| 9 | 8 | 7 | 6 | 5 | 4 | 3 | 2 | 1 | 0 |
| 1 | 1 | 0 | 1 | 0 | 0 | 1 | 0 | 1 | 0 |

Section 182 (260 "Y"):

| M | N | M | N | M | N | M | N |
|---|---|---|---|---|---|---|---|
| 7 | 6 | 5 | 4 | 3 | 2 | 1 | 0 |
| 1 | 1 | 0 | 1 | 1 | 0 | 0 | 0 |

LOCATION DEPENDENT MAXIMUM TRANSITION RUN LENGTH CODE WITH ALTERNATING CODE WORD LENGTH AND EFFICIENT K CONSTRAINT

CROSS-REFERENCE TO CO-PENDING APPLICATION

This application claims the benefit of U.S. Provisional Patent Application No. 60/075,723, entitled "LOCATION DEPENDENT MAXIMUM TRANSITION RUN CODE WITH EFFICIENT 'k' CONSTRAINT," filed on Feb. 24, 1998, and from U.S. Provisional Patent Application No. 60/042,518, entitled "MAXIMUM TRANSITION RUN LENGTH CODES WITH LOCATION DEPENDENT CONSTRAINTS," filed on Apr. 1, 1997. Cross-reference is also made to U.S. Ser. No.09/052,485, entitled "SYSTEMS AND SCHEMES FOR MAXIMUM TRANSITION RUN LENGTH CODES WITH LOCATION DEPENDENT CONSTRAINTS," filed on even date herewith.

BACKGROUND OF THE INVENTION

The present invention relates to digital communications systems and, more particularly to an encoding and decoding system in a disc drive.

In the field of digital communication systems, digital information is conveyed from a transmitter to a receiver through a channel. "Channel" is a generalized term that can include many different mediums. In data storage devices, such as magnetic disc drives, the channel includes a storage medium, and the digital information is transmitted to the storage medium and stored for some period of time before being recovered and delivered to the receiver.

A typical magnetic disc drive includes one or more rigid discs mounted for rotation on a hub or spindle. Each disc has an associated data head formed of a hydrodynamic bearing and a transducer, for communicating with the surface of the disc. An electromechanical actuator moves the data head radially over the disc surface for track seek operations and holds the transducer directly over a desired track on the disc surface for track following operations. A drive controller controls the disc drive based on commands received from a host system to retrieve information from the discs and to store information on the discs.

Information is typically stored in concentric data tracks on the disc surface. The direction of current through the transducer is controlled to encode magnetic flux reversals on the surface of the disc within the selected data track. In one type of coding, known as non-return-to-zero-inverse (NRZI) coding, a digital "1" is represented by a magnetic flux reversal from one bit position to the next in the data track, and a digital zero is represented by a lack of a magnetic flux reversal from one bit position to the next.

In retrieving data from the disc, the drive controller controls the electromechanical actuator so that the data head flies above the desired data track, senses the flux reversals stored in the data track, and generates a read signal based on those flux reversals. The read signal is typically conditioned and then decoded by the drive controller to recover the data represented by the flux reversals.

All channels, including disc drive storage channels, introduce noise into the signals they convey. To detect and sometimes to correct signal errors caused by this channel noise, a large number of coding techniques have been developed. These coding techniques convert data words formed of a number of data bits into code words formed of a number of code bits. Additional bits in the code words permit the detection and sometimes the correction of errors in the signals received from the channel.

The ratio of the number of data bits to the number of code bits is known as the code rate of the code. In general, the ability to detect and correct errors in a received signal increases as the code rate decreases because a lower code rate means a greater number of additional bits in the code word. However, each additional bit added by the encoder increases the time and energy needed to transmit the signal through the channel. Thus, to minimize the time and energy needed to send the code, the code rate should be minimized.

Depending on the detection scheme, the code imposes certain constraints on the code word pattern. For example, in a disc drive, the rotational speed of the spindle motor that rotates the magnetic media varies over time. This results in non-uniform time intervals between read signal voltage pulses. A phase locked loop (PLL) is used to lock the phase and frequency of the read timing clock to the phase and frequency of the read signal voltage pulses. To ensure that the PLL is updated regularly, a code can be used that limits the number of consecutive zeros to no greater than a maximum number "k". This kind of code is known as a run-length-limited (RLL) code with a "k"constraint. The smaller the value of "k", the better the performance of the PLL. However, the smaller the value of "k", the more difficult the code becomes to implement.

The code may also limit the number of consecutive ones in an encoded value to limit the effects of inter-symbol interference, which occurs when consecutive transitions in the transmitted signal interfere with each other. Such codes are known as maximum transition run (MTR) codes with an "L" constraint, where L is the maximum number of consecutive transitions allowed in the channel signal. For example, to avoid three or more consecutive transitions, codes with an MTR constraint L=2 can be designed. Although MTR codes reduce inter-symbol interference, they eliminate a large number of available code words making it difficult and sometimes impossible to implement MTR constraints with high code rates.

The present invention addresses these and other problems, and offers other advantages over the prior art.

SUMMARY OF THE INVENTION

One aspect of the present invention includes an encoder and method of encoding which encode successive data words into successive code words having alternating code word lengths. Each code word has a plurality of bit locations. A first maximum transition run constraint is imposed on a first set of the bit locations. Each bit location in the first set is spaced S bit locations apart from one another, where S is an integer greater than one. A second maximum transition run constraint, which is different than the first maximum transition run constraint, is imposed on a second set of the bit locations. The second set comprises each of the bit locations that are not in the first set. The alternating code word lengths and the value of S are defined such that corresponding bit locations in successive code words have the same maximum transition run constraint.

Another aspect of the present invention includes a decoder and a method of decoding a code word stream having alternating code word lengths and the above maximum transition run constraints.

BRIEF DESCRIPTION OF THE DRAWINGS

FIG. 3 is an organizational layout of a code word stream showing the numbering and naming convention used with one embodiment of the present invention.

FIG. 6 is an organizational layout of a code word stream showing the code word length and MTR constraint variables according to one embodiment of the present invention.

DETAILED DESCRIPTION OF THE PREFERRED EMBODIMENTS

Figure 1:
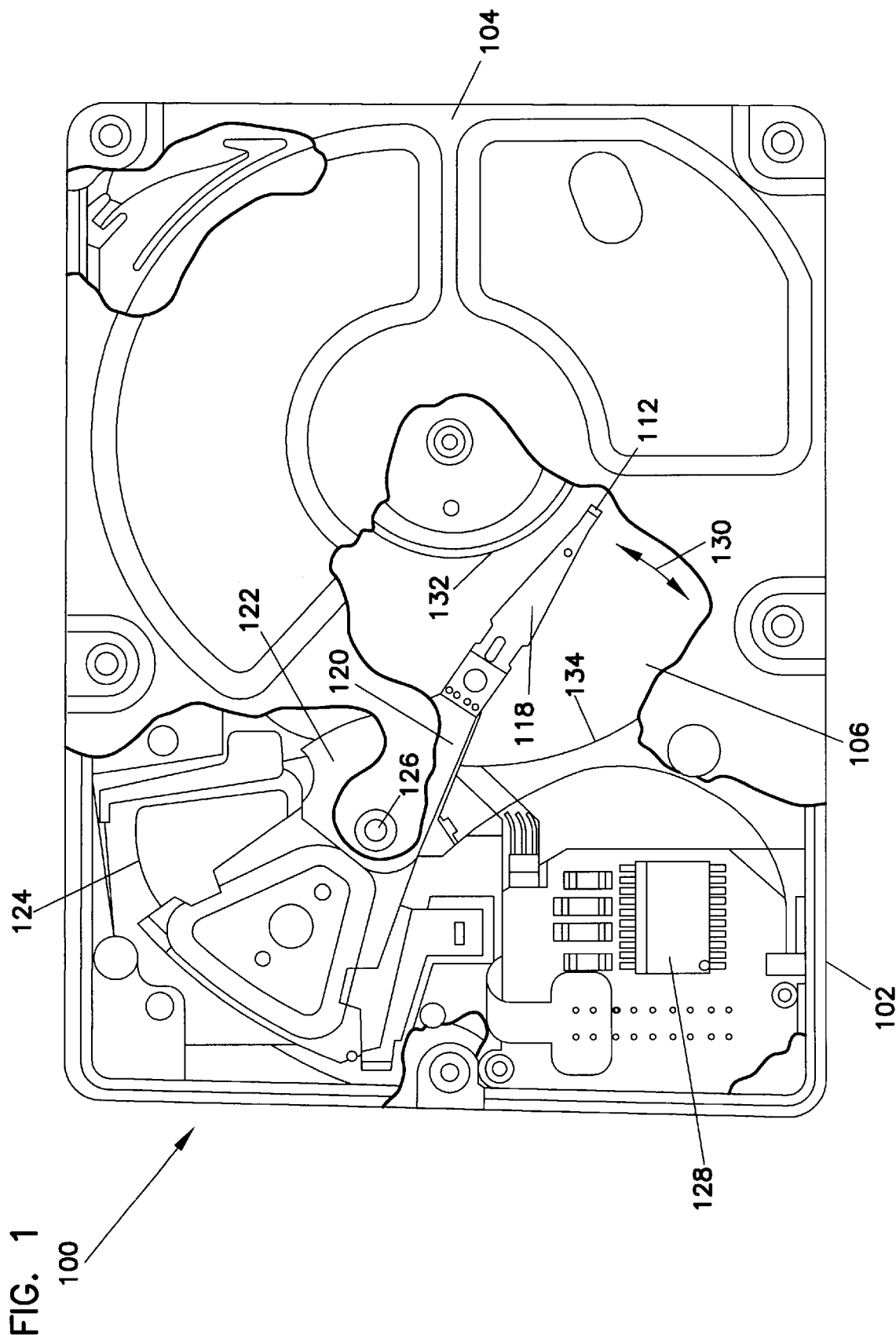
FIG. 1 is a plan view of a disc drive in which the encoder and decoder of the present invention can be used.

FIG. 1 is a plan view of a disc drive 100 in which the coding scheme of the present invention can be used. Disc drive 100 includes a housing with a base plate 102 and a top cover 104 (sections of top cover 104 are removed for clarity). Disc drive 100 further includes a disc pack 106, which is mounted on a spindle motor (not shown). Disc pack 106 can include a plurality of individual discs which are mounted for co-rotation about a central axis. Each disc surface has an associated head 112 which carries one or more read and write transducers for communicating with the disc surface. Each head 112 is supported by a suspension 118 which is in turn supported by a track accessing arm 120 of an actuator assembly 122.

Actuator assembly 122 is rotated about a shaft 126 by a voice coil motor 124, which is controlled by servo control circuitry within internal circuit 128. Head 112 travels in an arcuate path 130 between a disc inner diameter 132 and a disc outer diameter 134. During write operations, actuator assembly 122 positions head 112 over the desired data track. Write circuitry within internal circuitry 128 encodes the data to be stored into successive code words and sends the code words in the form of a serial analog write signal to the write transducer on head 112 which encodes magnetic flux reversals within a magnetic layer on the disc surface. During read operations, the read transducer in head 112 senses the magnetic flux reversals and generates a serial analog read signal. The analog read signal is converted into a serial digital signal, which is provided to detector and decoder circuitry within internal circuitry 128 to produce a recovered data signal.

Figure 2:
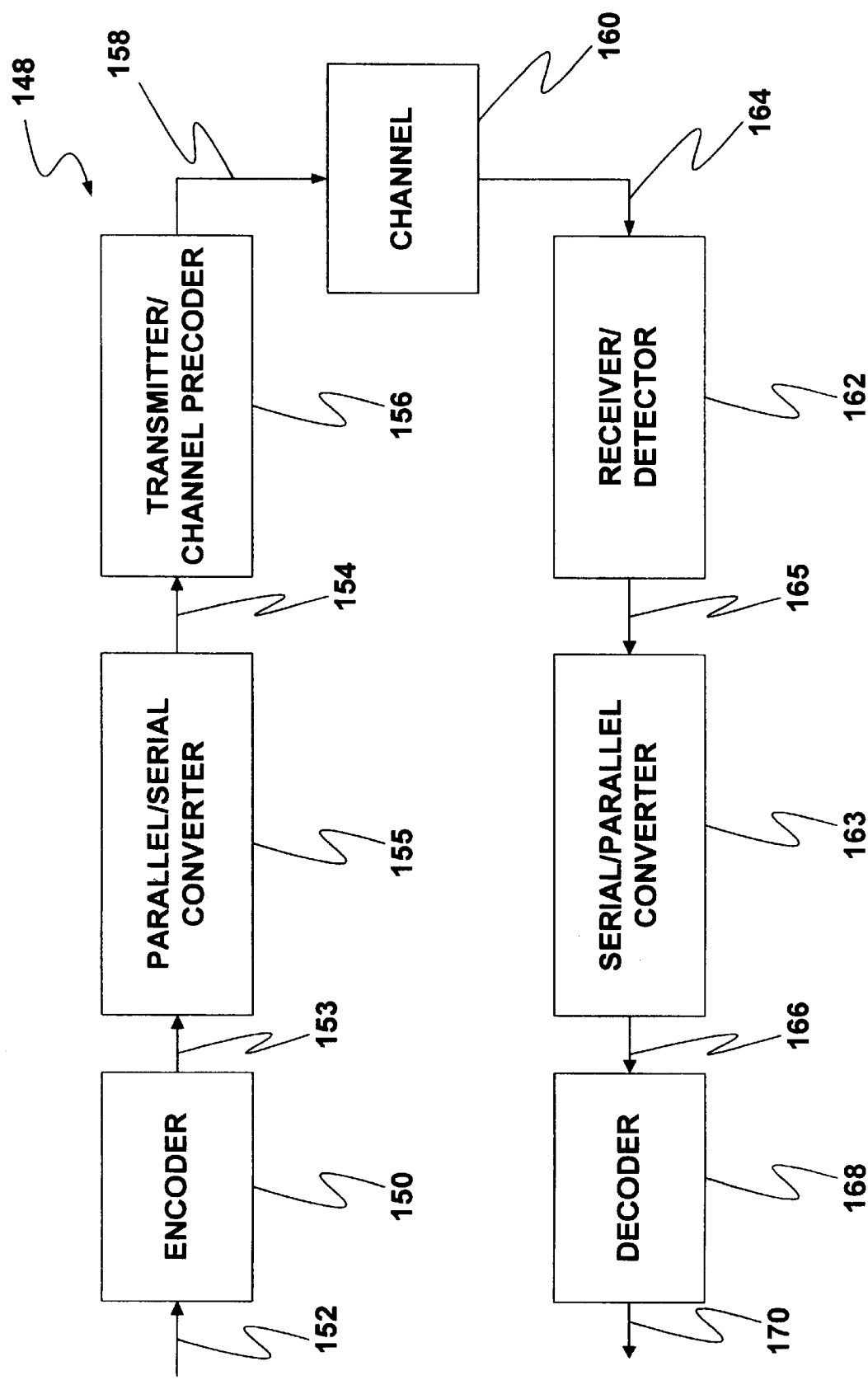
FIG. 2 is a block diagram of a generalized communication system in which the encoder and decoder can be used.

FIG. 2 is a block diagram of a generalized communication system 148 according to one embodiment of the present invention, which can be formed within disc drive 100, for example. Communication system 148 includes an encoder 150, which receives successive data words 152 and encodes the successive data words into successive code words 153. Each data word can include any number of symbols. In a binary system, for example, each symbol represents one logical data bit. In disc drive applications, a common data word length is eight bits. As described in more detail below, successive data words are encoded into successive code words having alternating code word lengths. In one embodiment, successive code words 153 alternate between eight bits and ten bits in length.

Parallel-to-serial converter 155 receives the successive code words 153, converts each code word into a serial representation and concatenates the serial representations to produce a serial stream of the code word bits 154. The encoding scheme used by encoder 150 imposes several constraints on the serial code word stream as discussed further below. Transmitter/channel precoder 156 receives the serial code word stream 154 and conditions the sequence so that it is optimized for the type of detector used to recover the signal from the channel. Transmitter/channel precoder 156 produces an encoded write signal 158, which is provided to channel 160.

In disc drive 100, channel 160 includes the write transducer in head 112, disc pack 106, and the read transducer in head 112. The encoded write signal is stored on the disc surface by the write transducer. During a read operation, the read transducer reads the stored, encoded information from the disc surface and conveys the encoded information to receiver/detector 162 as a read signal 164. Receiver/detector 162 amplifies and filters read signal 164, and then recovers the encoded information from the read signal using one of several known detection methods. For instance, receiver/detector 162 may use a Viterbi detector, Decision Feedback Equalization (DFE), Fixed-Delay Tree Search with Decision Feedback (FDTS/DF) or Reduced State Sequence detection (RSSE). After detecting and amplifying the signal from channel 160, receiver/detector 162 produces a recovered sequence of code word bits 165, which are provided to serial-to-parallel converter 163. The sequence of code word bits 165 is in a serial format at the input to serial-to-parallel converter 163.

Serial-to-parallel converter 163 groups the bits into code words and converts the code words from a serial format to a parallel format in which successively recovered code words have alternating code word lengths which correspond to the code word lengths generated by encoder 150. Serial-to-parallel converter 163 then outputs the successively recovered code words 166 in a parallel format to decoder 168. Decoder 168 uses the inverse of the coding rules used by encoder 150 and converts successive code words 166 into respective data words 170.

Encoder 150 imposes several constraints on the bit patterns in code word stream 153. Since the rotational velocity of the disc can vary over time, a phase locked loop (PLL) is used to lock the phase and frequency of the read timing clock to the phase and frequency of read signal 164. To ensure that the PLL is updated regularly, encoder 150 uses a code that limits the number of consecutive zeros in code word stream 153 to no greater than a maximum number "k". This kind of code is known as a run-length-limited (RLL) code with a "k" constraint. Encoder 150 also limits the number of consecutive ones in code word stream 154 to limit the effects of inter-symbol interference, which occurs when consecutive transitions in channel signal 158 interfere with each other. Such codes are known as maximum transition run (MTR) codes with an "L" constraint, where L is the maximum number of consecutive transitions allowed in channel signal 158.

In one example of the present invention, encoder 150 uses an 8/9 rate Location Dependent Maximum Transition Run (LDMTR) code with a "k" constraint of seven. The LDMTR code imposes different MTR constraint values for different pre-defined locations within each code word. For example, transition runs starting at even bit locations within code word stream 154 may have an MTR of three ($L_E=3$) while transition runs starting at odd bit locations within code word stream 154 may have an MTR of two ($L_O=2$). The 8/9 rate LDMTR code is achieved by encoding eight-bit data words into eight-bit code words and ten-bit code words alternately. Since the alternating code word lengths (e.g. eight and ten) are both even, corresponding bit locations in successive code words have the same MTR constraint. This allows encoder 150 to enforce the pre-defined MTR constraints over the boundaries between adjacent code words efficiently with a low complexity code.

FIG. 3 shows an organizational layout for a code word stream 178 that can appear as code word stream 154 or 165 of FIG. 2 in the above-example. Code word stream 178 is formed of three concatenated code words 180, 181 and 182. Code words 180 and 182 have code word lengths of eight bits, and code word 181 has a code word length of ten bits. The first bit in time is to the far left of stream 178 and later bits in time extend to the right. Line 184 assigns an integer to each bit in code words 180–182 based on its overall location within the respective code word. Under this numbering system, the first bit in each code word is the most significant bit and is numbered as bit seven for code words 180 and 182 and as bit nine for code word 181. The last bit in each code word is the least significant bit and is numbered as bit zero. Line 186 assigns an integer to each bit in code words 180–182 based on its temporal location within the overall code word stream 178.

Even/odd line 188 lies above line 186 and provides an "E" designation for each even bit in code word stream 178 and an "O" designation for each odd bit in code stream 178. The "E" and "O" designation is vertically aligned with its respective bit in code word stream 178. MTR line 188 designates the MTR constraint for each bit location in code words 180–182. Each even bit location in code word stream 178 has an MTR constraint of three, and each odd bit location in code stream 178 has an MTR constraint of two. Since the alternating code word lengths of code words 180–182 are both even, corresponding bit locations (as designated by line 184) in successive code words 180–182 have the same MTR constraint. This ensures that all MTR constraints are satisfied in the overall code stream 178 at the boundaries between the individual code words in the stream.

Encoder 150 generates the code words by using a state driven code table for mapping each data word pattern to a respective code word. The state driven code table is generated by collecting all the eight-bit and ten-bit patterns that satisfy the MTR constraints of $L_E=3$ and $L_O=2$, for example. There are 178 eight-bit patterns and 634 ten-bit patterns that satisfy the constraints.

The eight-bit patterns that satisfy the constraints are divided into two states, S0 and S1, and the ten-bit patterns that satisfy the constraints are divided into four states, S2, S3, S4 and S5. Table 1 shows the criteria used for dividing the patterns into respective states, where "X" designates a bit location having a binary value of "1" or "0".

TABLE 1

| STATE | CODE PATTERNS | | |
|---|---|---|---|
| S0 | 1XXXXXXX | | |
| S1 | 0XXXXXXX | | |
| S2 | 11XXXXXXXX | 1011XXXXXX | 0111XXXXXX |
| S3 | 100XXXXXXX | 1010XXXXXX | |
| S4 | 010XXXXXXX | 0110XXXXXX | |
| S5 | 00XXXXXXXX | | |

For the eight-bit patterns in states S0 and S1, those patterns having a "1" in the most significant bit position are grouped into state S0. Those patterns having a "0" in the most significant bit position are grouped into state S1. For the ten-bit patterns in states S2, S3, S4 and S5, those patterns beginning with a "11", "1011", or "0111" are grouped into state S2. Those patterns beginning with a "100" or "1010" are grouped into state S3. Those patterns beginning with a "010" or "0110" are grouped into state S4. Those patterns beginning with a "00" are grouped into state S5.

The valid eight-bit patterns in states S0 and S1 are shown in hexadecimal form in Tables 2A and 2B, respectively.

TABLE 2A

Patterns for State S0 (78 patterns):

80 81 82 83 84 85 86 87 88 89 8A 8B 8C 8D 90 91
92 93 94 95 96 97 98 99 9A 9B 9C 9D A0 A1 A2 A3
A4 A5 A6 A7 A8 A9 AA AB AC AD B0 B1 B2 B3 B4 B5
B6 B7 C0 C1 C2 C3 C4 C5 C6 C7 C8 C9 CA CB CC CD
D0 D1 D2 D3 D4 D5 D6 D7 D8 D9 DA DB DC DD

TABLE 2B

Patterns for State S1 (100 patterns):

00 01 02 03 04 05 06 07 08 09 0A 0B 0C 0D 10 11
12 13 14 15 16 17 18 19 1A 1B 1C 1D 20 21 22 23
24 25 26 27 28 29 2A 2B 2C 2D 30 31 32 33 34 35
36 37 40 41 42 43 44 45 46 47 48 49 4A 4B 4C 4D
50 51 52 53 54 55 56 57 58 59 5A 5B 5C 5D 60 61
62 63 64 65 66 67 68 69 6A 6B 6C 6D 70 71 72 73
74 75 76 77

The valid ten-bit patterns in states S2–S5 are shown in hexadecimal form in Tables 3A–3D, respectively.

TABLE 3A

Patterns for State S2 (156 patterns):

1C0 1C1 1C2 1C3 1C4 1C5 1C6 1C7 1C8 1C9 1CA 1CB 1CC 1CD 1D0
1D1 1D2 1D3 1D4 1D5 1D6 1D7 1D8 1D9 1DA 1DB 1DC 1DD 2C0
2C1
2C2 2C3 2C4 2C5 2C6 2C7 2C8 2C9 2CA 2CB 2CC 2CD 2D0 2D1 2D2
2D3 2D4 2D5 2D6 2D7 2D8 2D9 2DA 2DB 2DC 2DD 300 301 302
303 304 305 306 307 308 309 30A 30B 30C 30D 310 311 312 313 314
315 316 317 318 319 31A 31B 31C 31D 320 321 322 323 324 325 326
327 328 329 32A 32B 32C 32D 330 331 332 333 334 335 336 337 340
341 342 343 344 345 346 347 348 349 34A 34B 34C 34D 350 351 352
353 354 355 356 357 358 359 35A 35B 35C 35D 360 361 362 363 364
365 366 367 368 369 36A 36B 36C 36D 370 371 372 373 374 375 376
377

TABLE 3B

Patterns for State S3 (150 patterns):

200 201 202 203 204 205 206 207 208 209 20A 20B 20C 20D 210 211
212 213 214 215 216 217 218 219 21A 21B 21C 21D 220 221 222 223
224 225 226 227 228 229 22A 22B 22C 22D 230 231 232 233 234 235
236 237 240 241 242 243 244 245 246 247 248 249 24A 24B 24C 24D
250 251 252 253 254 255 256 257 258 259 25A 25B 25C 25D 260 261
262 263 264 265 266 267 268 269 26A 26B 26C 26D 270 271 272 273
274 275 276 277 280 281 828 283 284 285 286 287 288 289 28A 28B
28C 28D 290 291 292 293 294 295 296 297 298 299 29A 29B 29C 29C
29D 2A0 2A1 2A2 2A3 2A4 2A5 2A6 2A7 2A8 2A9 2AA 2AB 2AC
2AD 2B0 2B1 2B2 2B3 2B4 2B5 2B6 2B7

TABLE 3C

Patterns for State S4 (150 patterns):

100 101 102 103 104 105 106 107 108 109 10A 10B 10C 10D 110 111
112 113 114 115 116 117 118 119 11A 11B 11C 11D 120 121 122 123
124 125 126 127 128 129 12A 12B 12C 12D 130 131 132 133 134 135
136 137 140 141 142 143 144 145 146 147 148 149 14A 14B 14C 14D
150 151 152 153 154 155 156 157 158 159 15A 15B 15C 15D 160 161
162 163 164 165 166 167 168 169 16A 16B 16C 16D 170 171 172 173
174 175 176 177 180 181 182 183 184 185 186 187 188 189 18A 18B
18C 18D 190 191 192 193 194 195 196 197 198 199 19A 19B 19C 19D
1A0 1A1 1A2 1A3 1A4 1A5 1A6 1A7 1A8 1A9 1AA 1AB 1AC 1AD
1B0 1B1 1B2 1B3 1B4 1B5 1B6 1B7

TABLE 3D

Patterns for State S5 (178 patterns):

000 001 002 003 004 005 006 007 008 009 00A 00B 00C 00D 010 011
012 013 014 015 016 017 018 019 01A 01B 01C 01D 020 021 022 023
024 025 026 027 028 029 02A 02B 02C 02D 030 031 032 033 034 035
036 037 040 041 042 043 044 045 046 047 048 049 04A 04B 04C 04D
050 051 052 053 054 055 056 057 058 059 05A 05B 05C 05D 060 061
062 063 064 065 066 067 068 069 06A 06B 06C 06D 070 071 072 073
074 075 076 077 080 081 082 083 084 085 086 087 088 089 08A 08B
08C 08D 090 091 092 093 094 095 096 097 098 099 09A 09B 09C 09D
0A0 0A1 0A2 0A3 0A4 0A5 0A6 0A7 0A8 0A9 0AA 0AB 0AC 0AD
0B0 0B1 0B2 0B3 0B4 0B5 0B6 0B7 0C0 0C1 0C2 0C3 0C4 0C5 0C6
0C7 0C8 0C9 0CA 0CB 0CD 0D0 0D1 0D2 0D3 0D4 0D5 0D6 0D7 0D8
0D9 0DA 0DB 0DC 0DD

Since the state, S0 or S1, of the eight-bit code words can be uniquely determined by one most significant bit, and the state, S2, S3, S4 or S5, of the ten-bit code words can be uniquely determined by four most significant bits, error events of seven or less bits will at most cause decoding errors of two data words. Error events of eight to fifteen bits will, at worst, cause decoding errors of three data words.

To enforce the constraints of $L_E=3$ and $L_O=2$ such that invalid patterns do not occur at the boundaries when successive code words are concatenated with one another, each code word is associated with a next state pointer such that an eight-bit code word in state S0 or S1 always points to a ten-bit code word in state S2, S3, S4 or S5 and a ten-bit code word in state S2, S3, S4 or S5 always points to an eight-bit code word in states S0 or S1. The encoding process may start with either the eight-bit code words or the ten-bit code words.

Table 4 shows the valid next state pointers for each code pattern in states S0–S5, where "X"="0" or "1".

TABLE 4

| Current State | Code Pattern | Next State |
|---|---|---|
| S0, S1 | XXXXXXX0 | S2, S3, S4, S5 |
| | XXXXXX01 | S2, S3, S4, S5 |
| | XXXXXX11 | S4, S5 |
| S2, S3, S4, S5 | XXXXXXXXX0 | S0, S1 |
| | XXXXXXXX01 | S0, S1 |
| | XXXXXXXX11 | S1 |
| BIT POSITION | 9876543210 | |

Code patterns in states S0 and S1 that end with "0" in the "least significant" bit position [0] or [0:1] in bit positions [1:0] may have states S2, S3, S4 and S5 as their next states. Code patterns in states S0 and S1 that end with "11" in bit positions [1:0] may only have states S4 and S5 as their next states. This enforces the MTR constraint of $L_O=2$ on bit position [1] by ensuring that the first bit in the next successive code word in the code stream is a "0", as shown in the code patterns for states S4 and S5 in Table 1. Three "1's" are not possible at the boundary from states S0 and S1 to states S4 and S5, beginning at bit position [1].

Similarly, code patterns in states S2, S3, S4 and S5 that end with "0" in bit position [0] or "01" in bit positions [1:0] may have states S0 or S1 as their next states. Code patterns in states S2, S3, S4 and S5 that end with "11" in bit positions [1:0] may only have state S1 as their next state.

Using these state definitions, the mapping for an 8/9 rate code having a location dependent MTR constraint of $L_E=3$ and $L_O=2$ and with a "k" constraint of seven can be derived. Table 5 is a state diagram which maps each data word to a corresponding code word and next state value for each state S0–S5 in the example provided above. The eight-bit code words are represented by two hexadecimal values and the ten-bit code words are represented by three hexadecimal values. The data words are provided in the column labeled "DATA", the corresponding code words are provided in the columns labeled "CODE", and the corresponding next states are provided in the columns labeled "NXS".

TABLE 5

8/9 RATE LDMTR ($L_O = 2$, $L_E = 3$) CODE WITH "K" CONSTRAINT = 7

| | STATE 0 (S0) | | STATE 1 (S1) | | STATE 2 (S2) | | STATE 3 (S3) | | STATE 4 (S4) | | STATE 5 (S5) | |
|---|---|---|---|---|---|---|---|---|---|---|---|---|
| DATA | CODE | NXS | CODE | NXS | CODE | NXS | CODE | NXS | CODE | NXS | CODE | NXS |
| 00 | 81 | S2 | 11 | S2 | 311 | S0 | 211 | S0 | 111 | S0 | 011 | S0 |
| 01 | 85 | S2 | 15 | S2 | 315 | S0 | 215 | S0 | 115 | S0 | 015 | S0 |
| 02 | 89 | S2 | 19 | S2 | 319 | S0 | 219 | S0 | 119 | S0 | 019 | S0 |
| 03 | 8D | S2 | 1D | S2 | 31D | S0 | 21D | S0 | 11D | S0 | 01D | S0 |
| 04 | 91 | S2 | 21 | S2 | 321 | S0 | 221 | S0 | 121 | S0 | 021 | S0 |
| 05 | 95 | S2 | 25 | S2 | 325 | S0 | 225 | S0 | 125 | S0 | 025 | S0 |
| 06 | 99 | S2 | 29 | S2 | 329 | S0 | 229 | S0 | 129 | S0 | 029 | S0 |
| 07 | 9D | S2 | 2D | S2 | 32D | S0 | 22D | S0 | 12D | S0 | 02D | S0 |
| 08 | C1 | S2 | 51 | S2 | 311 | S1 | 211 | S1 | 111 | S1 | 011 | S1 |
| 09 | C5 | S2 | 55 | S2 | 315 | S1 | 215 | S1 | 115 | S1 | 015 | S1 |
| 0A | C9 | S2 | 59 | S2 | 319 | S1 | 219 | S1 | 119 | S1 | 019 | S1 |
| 0B | CD | S2 | 5D | S2 | 31D | S1 | 21D | S1 | 11D | S1 | 01D | S1 |
| 0C | D1 | S2 | 61 | S2 | 321 | S1 | 221 | S1 | 121 | S1 | 021 | S1 |
| 0D | D5 | S2 | 65 | S2 | 325 | S1 | 225 | S1 | 125 | S1 | 025 | S1 |
| 0E | D9 | S2 | 69 | S2 | 329 | S1 | 229 | S1 | 129 | S1 | 029 | S1 |
| 0F | DD | S2 | 6D | S2 | 32D | S1 | 22D | S1 | 12D | S1 | 02D | S1 |
| 10 | B0 | S2 | 10 | S2 | 351 | S0 | 251 | S0 | 151 | S0 | 051 | S0 |
| 11 | 82 | S2 | 12 | S2 | 355 | S0 | 255 | S0 | 155 | S0 | 055 | S0 |
| 12 | 84 | S2 | 14 | S2 | 359 | S0 | 259 | S0 | 159 | S0 | 059 | S0 |
| 13 | 86 | S2 | 16 | S2 | 35D | S0 | 25D | S0 | 15D | S0 | 05D | S0 |
| 14 | 88 | S2 | 18 | S2 | 361 | S0 | 261 | S0 | 161 | S0 | 061 | S0 |

TABLE 5-continued

8/9 RATE LDMTR ($L_O = 2$, $L_F = 3$) CODE WITH "K" CONSTRAINT = 7

| DATA | STATE 0 (S0) CODE | NXS | STATE 1 (S1) CODE | NXS | STATE 2 (S2) CODE | NXS | STATE 3 (S3) CODE | NXS | STATE 4 (S4) CODE | NXS | STATE 5 (S5) CODE | NXS |
|------|------|-----|------|-----|------|-----|------|-----|------|-----|------|-----|
| 15 | 8A | S2 | 1A | S2 | 365 | S0 | 265 | S0 | 165 | S0 | 065 | S0 |
| 16 | 8C | S2 | 1C | S2 | 369 | S0 | 269 | S0 | 169 | S0 | 069 | S0 |
| 17 | B1 | S2 | 32 | S2 | 36D | S0 | 26D | S0 | 16D | S0 | 06D | S0 |
| 18 | 90 | S2 | 20 | S2 | 351 | S1 | 251 | S1 | 151 | S1 | 051 | S1 |
| 19 | 92 | S2 | 22 | S2 | 355 | S1 | 255 | S1 | 155 | S1 | 055 | S1 |
| 1A | 94 | S2 | 24 | S2 | 359 | S1 | 259 | S1 | 159 | S1 | 059 | S1 |
| 1B | 96 | S2 | 26 | S2 | 35D | S1 | 25D | S1 | 15D | S1 | 05D | S1 |
| 1C | 98 | S2 | 28 | S2 | 361 | S1 | 261 | S1 | 161 | S1 | 061 | S1 |
| 1D | 9A | S2 | 2A | S2 | 365 | S1 | 265 | S1 | 165 | S1 | 065 | S1 |
| 1E | 9C | S2 | 2C | S2 | 369 | S1 | 269 | S1 | 169 | S1 | 069 | S1 |
| 1F | B2 | S2 | 36 | S2 | 36D | S1 | 26D | S1 | 16D | S1 | 06D | S1 |
| 20 | C0 | S2 | 50 | S2 | 301 | S0 | 281 | S0 | 181 | S0 | 081 | S0 |
| 21 | C2 | S2 | 52 | S2 | 305 | S0 | 285 | S0 | 185 | S0 | 085 | S0 |
| 22 | C4 | S2 | 54 | S2 | 309 | S0 | 289 | S0 | 189 | S0 | 089 | S0 |
| 23 | C6 | S2 | 56 | S2 | 30D | S0 | 28D | S0 | 18D | S0 | 08D | S0 |
| 24 | C8 | S2 | 58 | S2 | 341 | S0 | 291 | S0 | 191 | S0 | 091 | S0 |
| 25 | CA | S2 | 5A | S2 | 345 | S0 | 295 | S0 | 195 | S0 | 095 | S0 |
| 26 | AB | S4 | 5C | S2 | 349 | S0 | 299 | S0 | 180 | S0 | 099 | S0 |
| 27 | B5 | S2 | 72 | S2 | 34D | S0 | 29D | S0 | 19D | S0 | 09D | S0 |
| 28 | D0 | S2 | 60 | S2 | 301 | S1 | 281 | S1 | 181 | S1 | 081 | S1 |
| 29 | D2 | S2 | 62 | S2 | 305 | S1 | 285 | S1 | 185 | S1 | 085 | S1 |
| 2A | D4 | S2 | 64 | S2 | 309 | S1 | 289 | S1 | 189 | S1 | 089 | S1 |
| 2B | D6 | S2 | 66 | S2 | 30D | S1 | 28D | S1 | 18D | S1 | 08D | S1 |
| 2C | D8 | S2 | 68 | S2 | 341 | S1 | 291 | S1 | 191 | S1 | 091 | S1 |
| 2D | DA | S2 | 6A | S2 | 345 | S1 | 295 | S1 | 195 | S1 | 095 | S1 |
| 2E | DC | S2 | 6C | S2 | 349 | S1 | 299 | S1 | 199 | S1 | 099 | S1 |
| 2F | B6 | S2 | 76 | S2 | 34D | S1 | 29D | S1 | 19D | S1 | 09D | S1 |
| 30 | A0 | S2 | 40 | S2 | 2C1 | S0 | 241 | S0 | 141 | S0 | 041 | S0 |
| 31 | A2 | S2 | 42 | S2 | 2C5 | S0 | 245 | S0 | 145 | S0 | 045 | S0 |
| 32 | A4 | S2 | 44 | S2 | 2C9 | S0 | 249 | S0 | 149 | S0 | 049 | S0 |
| 33 | A6 | S2 | 46 | S2 | 2CD | S0 | 24D | S0 | 14D | S0 | 04D | S0 |
| 34 | A8 | S2 | 48 | S2 | 2D1 | S0 | 2A1 | S0 | 1A1 | S0 | 0A1 | S0 |
| 35 | AA | S2 | 4A | S2 | 2D5 | S0 | 2A5 | S0 | 1A5 | S0 | 0A5 | S0 |
| 36 | AC | S2 | 4C | S2 | 2D9 | S0 | 2A9 | S0 | 1A9 | S0 | 0A9 | S0 |
| 37 | B4 | S2 | 34 | S2 | 2DD | S0 | 2AD | S0 | 1AD | S0 | 0AD | S0 |
| 38 | A1 | S2 | 41 | S2 | 2C1 | S1 | 241 | S1 | 141 | S1 | 041 | S1 |
| 39 | A5 | S2 | 45 | S2 | 2C5 | S1 | 245 | S1 | 145 | S1 | 045 | S1 |
| 3A | A9 | S2 | 49 | S2 | 2C9 | S1 | 249 | S1 | 149 | S1 | 049 | S1 |
| 3B | AD | S2 | 4D | S2 | 2CD | S1 | 24D | S1 | 14D | S1 | 04D | S1 |
| 3C | 87 | S4 | 17 | S4 | 2D1 | S1 | 2A1 | S1 | 1A1 | S1 | 0A1 | S1 |
| 3D | 97 | S4 | 27 | S4 | 2D5 | S1 | 2A5 | S1 | 1A5 | S1 | 0A5 | S1 |
| 3E | C7 | S4 | 57 | S4 | 2D9 | S1 | 2A9 | S1 | 1A9 | S1 | 0A9 | S1 |
| 3F | D7 | S4 | 67 | S4 | 2DD | S1 | 2AD | S1 | 1AD | S1 | 0AD | S1 |
| 40 | 81 | S3 | 11 | S3 | 310 | S0 | 210 | S0 | 110 | S0 | 010 | S0 |
| 41 | 85 | S3 | 15 | S3 | 312 | S0 | 212 | S0 | 112 | S0 | 012 | S0 |
| 42 | 89 | S3 | 19 | S3 | 314 | S0 | 214 | S0 | 114 | S0 | 014 | S0 |
| 43 | 8D | S3 | 1D | S3 | 316 | S0 | 216 | S0 | 116 | S0 | 016 | S0 |
| 44 | 91 | S3 | 21 | S3 | 318 | S0 | 218 | S0 | 118 | S0 | 018 | S0 |
| 45 | 95 | S3 | 25 | S3 | 31A | S0 | 21A | S0 | 11A | S0 | 01A | S0 |
| 46 | 80 | S3 | 29 | S3 | 31C | S0 | 21C | S0 | 11C | S0 | 01C | S0 |
| 47 | 9D | S3 | 2D | S3 | 330 | S0 | 230 | S0 | 130 | S0 | 030 | S0 |
| 48 | C1 | S3 | 51 | S3 | 310 | S1 | 210 | S1 | 110 | S1 | 010 | S1 |
| 49 | C5 | S3 | 55 | S3 | 312 | S1 | 212 | S1 | 112 | S1 | 012 | S1 |
| 4A | C9 | S3 | 59 | S3 | 314 | S1 | 214 | S1 | 114 | S1 | 014 | S1 |
| 4B | CD | S3 | 5D | S3 | 316 | S1 | 216 | S1 | 116 | S1 | 016 | S1 |
| 4C | D1 | S3 | 61 | S3 | 318 | S1 | 218 | S1 | 118 | S1 | 018 | S1 |
| 4D | D5 | S3 | 65 | S3 | 31A | S1 | 21A | S1 | 11A | S1 | 01A | S1 |
| 4E | D9 | S3 | 69 | S3 | 31C | S1 | 21C | S1 | 11C | S1 | 01C | S1 |
| 4F | DD | S3 | 6D | S3 | 330 | S1 | 230 | S1 | 130 | S1 | 030 | S1 |
| 50 | B0 | S3 | 10 | S3 | 320 | S0 | 220 | S0 | 120 | S0 | 020 | S0 |
| 51 | 82 | S3 | 12 | S3 | 322 | S0 | 222 | S0 | 122 | S0 | 022 | S0 |
| 52 | 84 | S3 | 14 | S3 | 324 | S0 | 224 | S0 | 124 | S0 | 024 | S0 |
| 53 | 86 | S3 | 16 | S3 | 326 | S0 | 226 | S0 | 126 | S0 | 026 | S0 |
| 54 | 88 | S3 | 18 | S3 | 328 | S0 | 228 | S0 | 128 | S0 | 028 | S0 |
| 55 | 8A | S3 | 1A | S3 | 32A | S0 | 22A | S0 | 12A | S0 | 02A | S0 |
| 56 | 8C | S3 | 1C | S3 | 32C | S0 | 22C | S0 | 12C | S0 | 02C | S0 |
| 57 | B1 | S3 | 32 | S3 | 332 | S0 | 232 | S0 | 132 | S0 | 032 | S0 |
| 58 | 90 | S3 | 20 | S3 | 340 | S0 | 240 | S0 | 140 | S0 | 040 | S0 |
| 59 | 92 | S3 | 22 | S3 | 322 | S1 | 222 | S1 | 122 | S1 | 022 | S1 |
| 5A | 94 | S3 | 24 | S3 | 324 | S1 | 224 | S1 | 124 | S1 | 024 | S1 |
| 5B | 96 | S3 | 26 | S3 | 326 | S1 | 226 | S1 | 126 | S1 | 026 | S1 |
| 5C | 98 | S3 | 28 | S3 | 328 | S1 | 228 | S1 | 128 | S1 | 028 | S1 |
| 5D | 9A | S3 | 2A | S3 | 32A | S1 | 22A | S1 | 12A | S1 | 02A | S1 |

TABLE 5-continued

8/9 RATE LDMTR ($L_O$ = 2, $L_F$ = 3) CODE WITH "K" CONSTRAINT = 7

| | STATE 0 (S0) | | STATE 1 (S1) | | STATE 2 (S2) | | STATE 3 (S3) | | STATE 4 (S4) | | STATE 5 (S5) | |
|---|---|---|---|---|---|---|---|---|---|---|---|---|
| DATA | CODE | NXS | CODE | NXS | CODE | NXS | CODE | NXS | CODE | NXS | CODE | NXS |
| 5E | 9C | S3 | 2C | S3 | 32C | S1 | 22C | S1 | 12C | S1 | 02C | S1 |
| 5F | B2 | S3 | 36 | S3 | 332 | S1 | 232 | S1 | 132 | S1 | 032 | S1 |
| 60 | C0 | S3 | 50 | S3 | 350 | S0 | 250 | S0 | 150 | S0 | 050 | S0 |
| 61 | C2 | S3 | 52 | S3 | 352 | S0 | 252 | S0 | 152 | S0 | 052 | S0 |
| 62 | C4 | S3 | 54 | S3 | 354 | S0 | 254 | S0 | 154 | S0 | 054 | S0 |
| 63 | C6 | S3 | 56 | S3 | 356 | S0 | 256 | S0 | 156 | S0 | 056 | S0 |
| 64 | C8 | S3 | 58 | S3 | 358 | S0 | 258 | S0 | 158 | S0 | 058 | S0 |
| 65 | CA | S3 | 5A | S3 | 35A | S0 | 25A | S0 | 15A | S0 | 05A | S0 |
| 66 | CC | S3 | 5C | S3 | 35C | S0 | 25C | S0 | 15C | S0 | 05C | S0 |
| 67 | B5 | S3 | 72 | S3 | 334 | S0 | 234 | S0 | 134 | S0 | 034 | S0 |
| 68 | D0 | S3 | 60 | S3 | 350 | S1 | 250 | S1 | 150 | S1 | 050 | S1 |
| 69 | D2 | S3 | 62 | S3 | 352 | S1 | 252 | S1 | 152 | S1 | 052 | S1 |
| 6A | D4 | S3 | 64 | S3 | 354 | S1 | 254 | S1 | 154 | S1 | 054 | S1 |
| 6B | D6 | S3 | 66 | S3 | 356 | S1 | 256 | S1 | 156 | S1 | 056 | S1 |
| 6C | D8 | S3 | 68 | S3 | 358 | S1 | 258 | S1 | 158 | S1 | 058 | S1 |
| 6D | DA | S3 | 6A | S3 | 35A | S1 | 25A | S1 | 15A | S1 | 05A | S1 |
| 6E | DC | S3 | 6C | S3 | 35C | S1 | 25C | S1 | 15C | S1 | 05C | S1 |
| 6F | B6 | S3 | 76 | S3 | 334 | S1 | 234 | S1 | 134 | S1 | 034 | S1 |
| 70 | A0 | S3 | 40 | S3 | 360 | S0 | 260 | S0 | 160 | S0 | 060 | S0 |
| 71 | A2 | S3 | 42 | S3 | 362 | S0 | 262 | S0 | 162 | S0 | 062 | S0 |
| 72 | A4 | S3 | 44 | S3 | 364 | S0 | 264 | S0 | 164 | S0 | 064 | S0 |
| 73 | A6 | S3 | 46 | S3 | 366 | S0 | 266 | S0 | 166 | S0 | 066 | S0 |
| 74 | A8 | S3 | 48 | S3 | 368 | S0 | 268 | S0 | 168 | S0 | 068 | S0 |
| 75 | AA | S3 | 4A | S3 | 36A | S0 | 26A | S0 | 16A | S0 | 06A | S0 |
| 76 | AC | S3 | 4C | S3 | 36C | S0 | 26C | S0 | 16C | S0 | 06C | S0 |
| 77 | B4 | S3 | 34 | S3 | 336 | S0 | 236 | S0 | 136 | S0 | 036 | S0 |
| 78 | A1 | S3 | 41 | S3 | 30B | S1 | 20B | S1 | 10B | S1 | 0AB | S1 |
| 79 | A5 | S3 | 45 | S3 | 362 | S1 | 262 | S1 | 162 | S1 | 062 | S1 |
| 7A | A9 | S3 | 49 | S3 | 364 | S1 | 264 | S1 | 164 | S1 | 064 | S1 |
| 7B | AD | S3 | 4D | S3 | 366 | S1 | 280 | S0 | 166 | S1 | 066 | S1 |
| 7C | 87 | S5 | 17 | S5 | 368 | S1 | 268 | S1 | 168 | S1 | 068 | S1 |
| 7D | 97 | S5 | 27 | S5 | 36A | S1 | 26A | S1 | 16A | S1 | 06A | S1 |
| 7E | C7 | S5 | 57 | S5 | 36C | S1 | 26C | S1 | 16C | S1 | 06C | S1 |
| 7F | D7 | S5 | 67 | S5 | 336 | S1 | 236 | S1 | 136 | S1 | 036 | S1 |
| 80 | 81 | S4 | 11 | S4 | 1C0 | S0 | 2B0 | S0 | 1B0 | S0 | 0B0 | S0 |
| 81 | 85 | S4 | 15 | S4 | 1C2 | S0 | 282 | S0 | 182 | S0 | 082 | S0 |
| 82 | 89 | S4 | 19 | S4 | 1C4 | S0 | 284 | S0 | 184 | S0 | 084 | S0 |
| 83 | 8D | S4 | 1D | S4 | 1C6 | S0 | 286 | S0 | 186 | S0 | 086 | S0 |
| 84 | 91 | S4 | 21 | S4 | 1C8 | S0 | 288 | S0 | 188 | S0 | 088 | S0 |
| 85 | 95 | S4 | 25 | S4 | 1CA | S0 | 28A | S0 | 18A | S0 | 08A | S0 |
| 86 | 99 | S4 | 29 | S4 | 1CC | S0 | 28C | S0 | 18C | S0 | 08C | S0 |
| 87 | 9D | S4 | 2D | S4 | 370 | S0 | 270 | S0 | 170 | S0 | 070 | S0 |
| 88 | C1 | S4 | 51 | S4 | 1D7 | S1 | 2B0 | S1 | 1B0 | S1 | 0B0 | S1 |
| 89 | C5 | S4 | 55 | S4 | 1C2 | S1 | 282 | S1 | 182 | S1 | 082 | S1 |
| 8A | C9 | S4 | 59 | S4 | 1C4 | S1 | 284 | S1 | 184 | S1 | 084 | S1 |
| 8B | CD | S4 | 5D | S4 | 1C6 | S1 | 286 | S1 | 186 | S1 | 086 | S1 |
| 8C | D1 | S4 | 61 | S4 | 1C8 | S1 | 288 | S1 | 188 | S1 | 088 | S1 |
| 8D | D5 | S4 | 65 | S4 | 1CA | S1 | 28A | S1 | 18A | S1 | 08A | S1 |
| 8E | D9 | S4 | 69 | S4 | 1CC | S1 | 28C | S1 | 18C | S1 | 08C | S1 |
| 8F | DD | S4 | 6D | S4 | 370 | S1 | 270 | S1 | 170 | S1 | 070 | S1 |
| 90 | 83 | S4 | 13 | S4 | 1D0 | S0 | 2B2 | S0 | 1B2 | S0 | 0B2 | S0 |
| 91 | 82 | S4 | 12 | S4 | 1D2 | S0 | 292 | S0 | 192 | S0 | 092 | S0 |
| 92 | 84 | S4 | 14 | S4 | 1D4 | S0 | 294 | S0 | 194 | S0 | 094 | S0 |
| 93 | 86 | S4 | 16 | S4 | 1D6 | S0 | 296 | S0 | 196 | S0 | 096 | S0 |
| 94 | 88 | S4 | 18 | S4 | 1D8 | S0 | 298 | S0 | 198 | S0 | 098 | S0 |
| 95 | 8A | S4 | 1A | S4 | 1DA | S0 | 29A | S0 | 19A | S0 | 09A | S0 |
| 96 | 8C | S4 | 1C | S4 | 1DC | S0 | 29C | S0 | 19C | S0 | 09C | S0 |
| 97 | B1 | S4 | 32 | S4 | 372 | S0 | 272 | S0 | 172 | S0 | 072 | S0 |
| 98 | 93 | S4 | 23 | S4 | 1D0 | S1 | 2B2 | S1 | 1B2 | S1 | 0B2 | S1 |
| 99 | 92 | S4 | 22 | S4 | 1D2 | S1 | 292 | S1 | 192 | S1 | 092 | S1 |
| 9A | 94 | S4 | 24 | S4 | 1D4 | S1 | 294 | S1 | 194 | S1 | 094 | S1 |
| 9B | 96 | S4 | 26 | S4 | 1D6 | S1 | 296 | S1 | 196 | S1 | 096 | S1 |
| 9C | 98 | S4 | 28 | S4 | 1D8 | S1 | 298 | S1 | 198 | S1 | 098 | S1 |
| 9D | 9A | S4 | 2A | S4 | 1DA | S1 | 29A | S1 | 19A | S1 | 09A | S1 |
| 9E | 9C | S4 | 2C | S4 | 1DC | S1 | 29C | S1 | 19C | S1 | 09C | S1 |
| 9F | B2 | S4 | 36 | S4 | 372 | S1 | 272 | S1 | 172 | S1 | 072 | S1 |
| A0 | C3 | S4 | 53 | S4 | 2C0 | S0 | 2B4 | S0 | 1B4 | S0 | 0B4 | S0 |
| A1 | C2 | S4 | 52 | S4 | 2C2 | S0 | 242 | S0 | 142 | S0 | 042 | S0 |
| A2 | C4 | S4 | 54 | S4 | 2C4 | S0 | 244 | S0 | 144 | S0 | 044 | S0 |
| A3 | C6 | S4 | 56 | S4 | 2C6 | S0 | 246 | S0 | 146 | S0 | 046 | S0 |
| A4 | C8 | S4 | 58 | S4 | 2C8 | S0 | 248 | S0 | 148 | S0 | 048 | S0 |
| A5 | CA | S4 | 5A | S4 | 2CA | S0 | 24A | S0 | 14A | S0 | 04A | S0 |
| A6 | CC | S4 | 5C | S4 | 2CC | S0 | 24C | S0 | 14C | S0 | 04C | S0 |

TABLE 5-continued

8/9 RATE LDMTR ($L_O$ = 2, $L_F$ = 3) CODE WITH "K" CONSTRAINT = 7

| | STATE 0 (S0) | | STATE 1 (S1) | | STATE 2 (S2) | | STATE 3 (S3) | | STATE 4 (S4) | | STATE 5 (S5) | |
|---|---|---|---|---|---|---|---|---|---|---|---|---|
| DATA | CODE | NXS | CODE | NXS | CODE | NXS | CODE | NXS | CODE | NXS | CODE | NXS |
| A7 | B5 | S4 | 72 | S4 | 374 | S0 | 274 | S0 | 174 | S0 | 074 | S0 |
| A8 | D3 | S4 | 63 | S4 | 2D7 | S1 | 2B4 | S1 | 1B4 | S1 | 0B4 | S1 |
| A9 | D2 | S4 | 62 | S4 | 2C2 | S1 | 242 | S1 | 142 | S1 | 042 | S1 |
| AA | D4 | S4 | 64 | S4 | 2C4 | S1 | 244 | S1 | 144 | S1 | 044 | S1 |
| AB | D6 | S4 | 4B | S4 | 2C6 | S1 | 246 | S1 | 146 | S1 | 046 | S1 |
| AC | D8 | S4 | 68 | S4 | 2C8 | S1 | 248 | S1 | 148 | S1 | 048 | S1 |
| AD | DA | S4 | 6A | S4 | 2CA | S1 | 24A | S1 | 14A | S1 | 04A | S1 |
| AE | DC | S4 | 6C | S4 | 2CC | S1 | 24C | S1 | 14C | S1 | 04C | S1 |
| AF | B6 | S4 | 76 | S4 | 374 | S1 | 274 | S1 | 174 | S1 | 074 | S1 |
| B0 | A3 | S4 | 43 | S4 | 2D0 | S0 | 2B6 | S0 | 1B6 | S0 | 0B6 | S0 |
| B1 | A2 | S4 | 42 | S4 | 2D2 | S0 | 2A2 | S0 | 1A2 | S0 | 0A2 | S0 |
| B2 | A4 | S4 | 44 | S4 | 2D4 | S0 | 2A4 | S0 | 1A4 | S0 | 0A4 | S0 |
| B3 | A6 | S4 | 46 | S4 | 2D6 | S0 | 2A6 | S0 | 1A6 | S0 | 0A6 | S0 |
| B4 | A8 | S4 | 48 | S4 | 2D8 | S0 | 2A8 | S0 | 1A8 | S0 | 0A8 | S0 |
| B5 | AA | S4 | 4A | S4 | 2DA | S0 | 2AA | S0 | 1AA | S0 | 0AA | S0 |
| B6 | AC | S4 | 4C | S4 | 2DC | S0 | 2AC | S0 | 1AC | S0 | 0AC | S0 |
| B7 | B4 | S4 | 34 | S4 | 376 | S0 | 276 | S0 | 176 | S0 | 076 | S0 |
| B8 | A1 | S4 | 41 | S4 | 2D0 | S1 | 2B6 | S1 | 1B6 | S1 | 0B6 | S1 |
| B9 | A5 | S4 | 45 | S4 | 2D2 | S1 | 2A2 | S1 | 1A2 | S1 | 0A2 | S1 |
| BA | A9 | S4 | 49 | S4 | 2D4 | S1 | 2A4 | S1 | 1A4 | S1 | 0A4 | S1 |
| BB | AD | S4 | 4D | S4 | 2D6 | S1 | 2A6 | S1 | 1A6 | S1 | 0A6 | S1 |
| BC | 8B | S4 | 1B | S4 | 2D8 | S1 | 2A8 | S1 | 1A8 | S1 | 0A8 | S1 |
| BD | 9B | S4 | 2B | S4 | 2DA | S1 | 2AA | S1 | 1AA | S1 | 0AA | S1 |
| BE | CB | S4 | 5B | S4 | 2DC | S1 | 2AC | S1 | 1AC | S1 | 0AC | S1 |
| BF | DB | S4 | 6B | S4 | 376 | S1 | 276 | S1 | 176 | S1 | 076 | S1 |
| C0 | 81 | S5 | 11 | S5 | 331 | S0 | 209 | S0 | 109 | S0 | 0C0 | S0 |
| C1 | 85 | S5 | 15 | S5 | 302 | S0 | 202 | S0 | 102 | S0 | 0C2 | S0 |
| C2 | 89 | S5 | 19 | S5 | 304 | S0 | 204 | S0 | 104 | S0 | 0C4 | S0 |
| C3 | 8D | S5 | 1D | S5 | 306 | S0 | 206 | S0 | 106 | S0 | 0C6 | S0 |
| C4 | 91 | S5 | 21 | S5 | 308 | S0 | 208 | S0 | 108 | S0 | 0C8 | S0 |
| C5 | 95 | S5 | 25 | S5 | 30A | S0 | 20A | S0 | 10A | S0 | 0CA | S0 |
| C6 | 99 | S5 | 29 | S5 | 30C | S0 | 20C | S0 | 10C | S0 | 080 | S0 |
| C7 | 9D | S5 | 2D | S5 | 335 | S0 | 205 | S0 | 105 | S0 | 035 | S0 |
| C8 | C1 | S5 | 51 | S5 | 331 | S1 | 209 | S1 | 109 | S1 | 0A3 | S1 |
| C9 | C5 | S5 | 55 | S5 | 302 | S1 | 202 | S1 | 102 | S1 | 0C2 | S1 |
| CA | C9 | S5 | 59 | S5 | 304 | S1 | 204 | S1 | 104 | S1 | 0C4 | S1 |
| CB | CD | S5 | 5D | S5 | 306 | S1 | 206 | S1 | 106 | S1 | 0C6 | S1 |
| CC | D1 | S5 | 61 | S5 | 308 | S1 | 208 | S1 | 108 | S1 | 0C8 | S1 |
| CD | D5 | S5 | 65 | S5 | 30A | S1 | 20A | S1 | 10A | S1 | 0CA | S1 |
| CE | D9 | S5 | 69 | S5 | 30C | S1 | 20C | S1 | 10C | S1 | 0CC | S1 |
| CF | DD | S5 | 6D | S5 | 335 | S1 | 205 | S1 | 105 | S1 | 035 | S1 |
| D0 | 83 | S5 | 13 | S5 | 371 | S0 | 20D | S0 | 10D | S0 | 0D0 | S0 |
| D1 | 82 | S5 | 12 | S5 | 342 | S0 | 231 | S0 | 131 | S0 | 0D2 | S0 |
| D2 | 84 | S5 | 14 | S5 | 344 | S0 | 271 | S0 | 171 | S0 | 0D4 | S0 |
| D3 | 86 | S5 | 16 | S5 | 346 | S0 | 2B1 | S0 | 1B1 | S0 | 0D6 | S0 |
| D4 | A7 | S4 | 35 | S4 | 348 | S0 | 235 | S0 | 135 | S0 | 0D8 | S0 |
| D5 | 8A | S5 | 1A | S5 | 34A | S0 | 275 | S0 | 175 | S0 | 0DA | S0 |
| D6 | 8C | S5 | 1C | S5 | 34C | S0 | 2B5 | S0 | 1B5 | S0 | 0DC | S0 |
| D7 | B1 | S5 | 32 | S5 | 375 | S0 | 290 | S0 | 190 | S0 | 090 | S0 |
| D8 | 93 | S5 | 23 | S5 | 371 | S1 | 20D | S1 | 10D | S1 | 0D0 | S1 |
| D9 | 92 | S5 | 22 | S5 | 342 | S1 | 231 | S1 | 131 | S1 | 0D2 | S1 |
| DA | 94 | S5 | 24 | S5 | 344 | S1 | 271 | S1 | 171 | S1 | 0D4 | S1 |
| DB | 96 | S5 | 26 | S5 | 346 | S1 | 2B1 | S1 | 1B1 | S1 | 0D6 | S1 |
| DC | B7 | S4 | 37 | S4 | 348 | S1 | 235 | S1 | 135 | S1 | 0D8 | S1 |
| DD | 9A | S5 | 2A | S5 | 34A | S1 | 275 | S1 | 175 | S1 | 0DA | S1 |
| DE | 9C | S5 | 2C | S5 | 34C | S1 | 2B5 | S1 | 1B5 | S1 | 0DC | S1 |
| DF | B2 | S5 | 36 | S5 | 375 | S1 | 290 | S1 | 190 | S1 | 090 | S1 |
| E0 | C3 | S5 | 53 | S5 | 1C1 | S0 | 213 | S1 | 113 | S1 | 0C1 | S0 |
| E1 | C2 | S5 | 52 | S5 | 1C5 | S0 | 217 | S1 | 117 | S1 | 0C5 | S0 |
| E2 | C4 | S5 | 54 | S5 | 1C9 | S0 | 21B | S1 | 11B | S1 | 0C9 | S0 |
| E3 | C6 | S5 | 56 | S5 | 1CD | S0 | 203 | S1 | 103 | S1 | 0CD | S0 |
| E4 | A7 | S5 | 35 | S5 | 1D1 | S0 | 223 | S1 | 123 | S1 | 0D1 | S0 |
| E5 | CA | S5 | 5A | S5 | 1D5 | S0 | 227 | S1 | 127 | S1 | 0D5 | S0 |
| E6 | CC | S5 | 5C | S5 | 1D9 | S0 | 22B | S1 | 12B | S1 | 0D9 | S0 |
| E7 | B5 | S5 | 72 | S5 | 1DD | S0 | 207 | S1 | 107 | S1 | 0DD | S0 |
| E8 | D3 | S5 | 63 | S5 | 1C1 | S1 | 253 | S1 | 153 | S1 | 0C1 | S1 |
| E9 | D2 | S5 | 62 | S5 | 1C5 | S1 | 257 | S1 | 157 | S1 | 0C5 | S1 |
| EA | D4 | S5 | 64 | S5 | 1C9 | S1 | 25B | S1 | 15B | S1 | 0C9 | S1 |
| EB | D6 | S5 | 66 | S5 | 1CD | S1 | 233 | S1 | 133 | S1 | 0CD | S1 |
| EC | B7 | S5 | 37 | S5 | 1D1 | S1 | 263 | S1 | 163 | S1 | 0D1 | S1 |
| ED | DA | S5 | 6A | S5 | 1D5 | S1 | 267 | S1 | 167 | S1 | 0D5 | S1 |
| EE | DC | S5 | 6C | S5 | 1D9 | S1 | 26B | S1 | 16B | S1 | 0D9 | S1 |
| EF | B6 | S5 | 76 | S5 | 1DD | S1 | 237 | S1 | 137 | S1 | 0DD | S1 |

TABLE 5-continued

8/9 RATE LDMTR ($L_O = 2$, $L_F = 3$) CODE WITH "K" CONSTRAINT = 7

| | STATE 0 (S0) | | STATE 1 (S1) | | STATE 2 (S2) | | STATE 3 (S3) | | STATE 4 (S4) | | STATE 5 (S5) | |
|---|---|---|---|---|---|---|---|---|---|---|---|---|
| DATA | CODE | NXS | CODE | NXS | CODE | NXS | CODE | NXS | CODE | NXS | CODE | NXS |
| F0 | A3 | S5 | 43 | S5 | 313 | S1 | 283 | S1 | 183 | S1 | 013 | S1 |
| F1 | A2 | S5 | 42 | S5 | 323 | S1 | 287 | S1 | 187 | S1 | 023 | S1 |
| F2 | A4 | S5 | 44 | S5 | 353 | S1 | 28B | S1 | 18B | S1 | 053 | S1 |
| F3 | A6 | S5 | 46 | S5 | 343 | S1 | 273 | S1 | 173 | S1 | 063 | S1 |
| F4 | B3 | S5 | 31 | S5 | 2C3 | S1 | 293 | S1 | 193 | S1 | 083 | S1 |
| F5 | AA | S5 | 4A | S5 | 2D3 | S1 | 297 | S1 | 197 | S1 | 093 | S1 |
| F6 | AC | S5 | 4C | S5 | 1C3 | S1 | 29B | S1 | 19B | S1 | 0C3 | S1 |
| F7 | B4 | S5 | 34 | S5 | 1D3 | S1 | 277 | S1 | 177 | S1 | 0D3 | S1 |
| F8 | A1 | S5 | 41 | S5 | 31B | S1 | 243 | S1 | 143 | S1 | 01B | S1 |
| F9 | A5 | S5 | 45 | S5 | 32B | S1 | 247 | S1 | 147 | S1 | 02B | S1 |
| FA | A9 | S5 | 49 | S5 | 35B | S1 | 24B | S1 | 14B | S1 | 05B | S1 |
| FB | AD | S5 | 4D | S5 | 34B | S1 | 2B3 | S1 | 1B3 | S1 | 06B | S1 |
| FC | 8B | S5 | 1B | S5 | 2CB | S1 | 2A3 | S1 | 1A3 | S1 | 08B | S1 |
| FD | 9B | S5 | 2B | S5 | 2DB | S1 | 2A7 | S1 | 1A7 | S1 | 09B | S1 |
| FE | CB | S5 | 5B | S5 | 1CB | S1 | 2AB | S1 | 1AB | S1 | 0CB | S1 |
| FF | DB | S5 | 6B | S5 | 1DB | S1 | 2B7 | S1 | 1B7 | S1 | 0DB | S1 |

An example of a decoding sequence through the state diagram shown in Table 5 can be explained with reference to the code word stream shown in FIG. 3. Hexadecimal line 200 provides a hexadecimal representation "81", "34A" and "D8" for code words 180, 181 and 182, respectively, in code word stream 178. State line 202 indicates the present state of decoder 168 as the respective code word is being decoded. Data line 204 indicates the corresponding decoded data word in hexadecimal form for code words 180 and 181. As code word 180 having a hexadecimal value of "81" is applied to decoder 168, decoder 168 is in state S0. Looking at the top left corner of Table 5, the corresponding data word for hexadecimal value "81" is either "00", "40", "80" or "C0", depending on the value of the next state pointer. In this example, the next state pointer points to state "S2 " (for code word 181) so the corresponding data word is "00". Code word 181 has a hexadecimal value of "34A". In the column corresponding to state S2, code "34A" corresponds to either data word "D5" or data word "DD", depending on whether the next state pointer is state S0 or S1. In this example, the next state pointer points to state S0 so the corresponding data word is "D5". This operation continues for each successive code word. The inverse of operation is used by encoder 150 to encode the data words.

In order to map eight-bit data words into eight-bit or ten-bit code words, only $2^8$ or 256 unique combinations of code word patterns and next state values are required for each state S0 –S5. Since each state has more than 256 combinations, undesirable code word patterns or long-run patterns with small Euclidian distances can be avoided by systematically eliminating them from the state diagram. For example, all code word pattern combinations that will cause long runs of zeroes, i.e. greater than the "k" constraint, can be eliminated. In the example provided in Table 5, enough patterns were eliminated to reduce the "k" constraint to seven while still keeping at least 256 combinations in each state. In addition, all code word patterns are eliminated that may cause long runs of "110110. . .", which is known as a quasi-catastrophic sequence that may force the detector to keep a long memory length.

Figure 4:
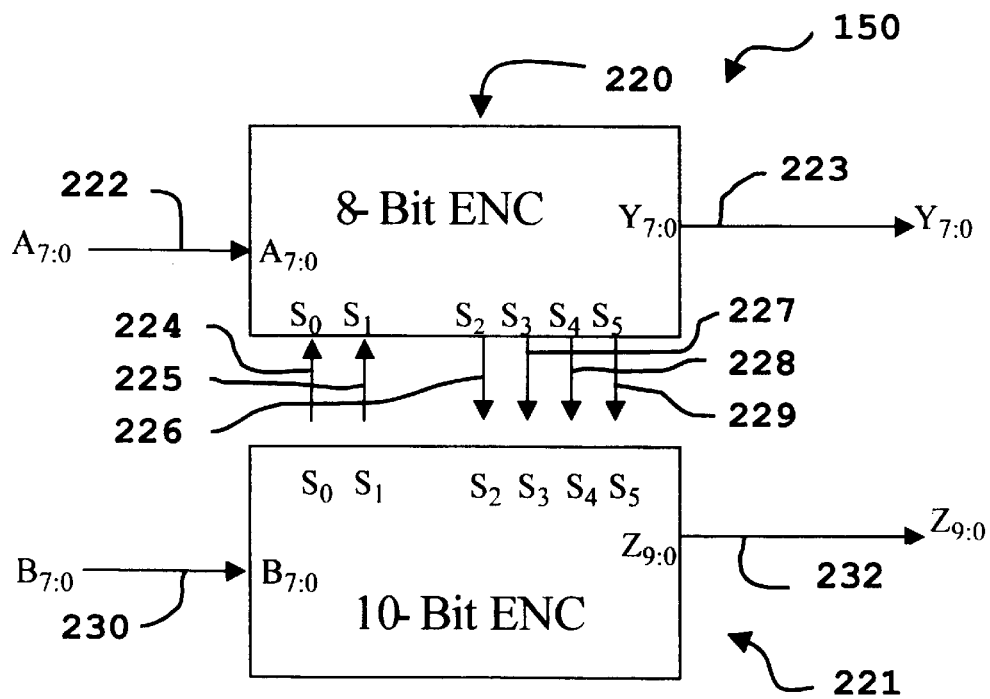
FIG. 4 is a block diagram of an encoder according to one embodiment of the present invention.

FIG. 4 is a block diagram illustrating encoder 150 which, in the above-example, encodes successive data words into successive code words having alternating code word lengths of eight bits and ten bits. Encoder 150 includes eight-bit encoder 220 and ten-bit encoder 221. Eight-bit encoder 220 includes eight-bit data word input A[7:0] which is coupled to bus 222, eight-bit code word output Y[7:0] which is coupled to bus 223, next state pointer inputs $S_0$ and $S_1$ which are coupled to buses 224 and 225, respectively, and next state pointer outputs $S_2$–$S_5$ which are coupled to buses 226–229, respectively. Ten-bit encoder 221 includes eight-bit data word input B[7:0] which is coupled to bus 230, ten-bit code word output Z[9:0] which is coupled to bus 232, next state pointer inputs $S_2$–$S_5$ which are coupled to buses 226–229, respectively, and next state pointer outputs $S_0$ and $S_1$ which are coupled to buses 224 and 225, respectively. Incoming data words are time-multiplexed onto data word inputs A[7:0] and B[7:0], and the corresponding code words generated on code word outputs Y[7:0] and Z[9:0] are time-multiplexed into parallel-to-serial converter 155 (shown in FIG. 2).

The operation of eight-bit encoder 220 and ten-bit encoder 221, which implement the state diagram shown in Table 5, can be expressed in Boolean algebra and implemented in either hardware or software. The Boolean equations for eight-bit encoder 220 and ten-bit encoder 221 are provided in Tables 6A and 6B below, where "|" represents a bitwise logical OR, "&" represents a bitwise logical AND, "|" represents a bitwise logical exclusive-OR, and "X" represents the inverse of X.

TABLE 6A

EIGHT-BIT ENCODER BOOLEAN EQUATIONS:
NH2 = A7 & A6 & A5 & A4
NH4 = A7 & A6 & A5 & A4
NHA = A7 & A6 & A5 & A4
NHD = A7 & A6 & A5 & A4
NL6 = A3 & A2 & A1 & A0

TABLE 6A-continued

```
NLB = A3 & A2 & A1 & A0
GA = A5 & A4
HA = A5 & A4 & A3
JA = GA & HA & (((A5 | A4)&(A2&A1&A0)) | (A7&A2&A1&A0))
KA = (A7&A6 & GA&HA) & (A2&A1&A0)
LA = GA & HA & JA & KA
LAA = S0 & LA & A7&A5&A3&A2&A1&A0
YY7 = S0
YT6 = (JA&((S0&A0&A4) | (S1&((A0&A5) | A4)))) | (LA&(A4 | (S1&A5&A4)))
YY6 = (GA&A3) | (HA&((S1&A2) | (A2&A1))) | YT6
YT5 = (JA&((S0&A5&A4) | (S1&A3) | A0)) | KA | (LA&((S0&A5&A4) | (S1&A3))) | LAA
YY5 = (GA&S1&A2) | (HA&((S0&A2) | (S1&A2&A0)))
YT4 = (LA&((S0&A3) | (S1&A3&(A5 | A4)))) | LAA
YU4 = (JA&((S0&A3) | (S1&(A5 | A4)&A3) | A0)) | (KA&((S0&(A3 | (A5&A4))) | S1)) | YT4
YY4 = (GA&((S1&A2) | (S0&A2))) | (HA&A2&((S1&A0) | (S0&A0))) | YU4
YY3 = (GA&A1) | (HA&((A2&A1) | (A7&A2))) | (LA&A2)
YT2 = (JA&A0&((S0&A5) | (S1&(A3 | (A5&A4))))) | (KA&(A5 | A4)) | (LA&A1)
YY2 = (GA&A0) | (HA&((A7&A2) | (A2&A0))) | YT2
YT1 = (KA&(S0 | (S1&A3))) | (LA&A0)
YY1 = (HA&A2) | (JA&(((S0&A3) | (S1&(A5 | A4))) | A0)) | YT1
YY0 = GA | HA | (JA&(((S0&A3&(A5 | A4))) | A0)) | KA
QA = (NH2&NL6&S0) | (NH4&NL6&S0) | (NHA&NLB&S1)
Y7 = (YY7&QA) | (QA&A2)
Y6 = (YY6&QA) | (QA&A7)
Y5 = (YY5&QA) | (QA&A5&A2)
Y4 = (YY4&QA)
Y3 = (YY3&QA) | (QA&A5)
Y2 = (YY2&QA)
Y1 = (YY1&QA) | (QA&A5)
Y0 = (YY0&QA) | (QA&A5)
T1 = A5&A4&A3&A2
T2 = (NHD&A2&A1&A0) | (NH2&NL6&S0)
S2 = A7 & A6 & T1
S3 = A7 & A6 & T1
S4 = (A7&A6) | (A6&T1) | T2
S5 = ((A7&A6) | (A6&T1)) & T2
```

TABLE 6B

```
TEN-BIT ENCODER BOOLEAN EQUATIONS:
S345 = S3|S4|S5
NH2 = B7 & B6 & B5 & B4
NH5 = B7 & B6 & B5 & B4
NH7 = B7 & B6 & B5 & B4
NHC = B7 & B6 & B5 & B4
NL6 = B3 & B2 & B1 & B0
NL8 = B3 & B2 & B1 & B0
NLB = B3 & B2 & B1 & B0
GB = B7 & B6
G9 = S2|S3
G8 = (S2&(B5|B4)) | S4
G7 = (S345&B5&(B4|(B4&B2))) | (S2&B5&B4)
G6 = (B5&B4) | (S2&B5&B2) | (B5&B4&B2)
G5 = (B5&B2) | (S345&B5&B4&B2)
G4 = (B5&B2) | (S2&B5&B4&B2) | (S345&B5&B4&B2)
G3 = B1
G2 = B0
G1 = 0
G0 = 1
HB = B7 & B6
HB1 = B4&B3&B2&B1&B0
HB2 = B2&B1&B0
HB3 = HB&HB1&HB2
H9 = S2|S3
H8 = S2|S4
H7 = (HB1&B5&S5)
H6 = (HB1&B5) | (HB3&B5)
H5 = (HB1&B5&S5) | HB2 | (HB3&B4)
H4 = HB2 | (HB3&B4)
H3 = (HB1&B5) |(HB3&B2)
H2 = (HB2&B5) |(HB3&B1)
H1 = (HB1&B5) | (HB2&B4) | (HB3&B0)
H0 = HB1&B5
JB = B7&B6
JB1 = S2&B4&B3&B2&B1&B0
JB2 = B2 & B1 & B0
```

TABLE 6B-continued

```
JB3 = S345 & (B2&B1&B0)
JB4 = JB & JB1 & JB2 & JB3
J9 = (JB1&B5) | (JB2&(S2|S3)) | (JB3&S3) | (JB4&((S2&B5)|S3))
J8 = (JB1&B5 ) | (JB2&(S2|S4)) | (JB3&S4) | (JB4&((S2&B5)|S4))
J7 = JB1 | JB3 | (JB4&(S2|B5|B4))
J6 = JB1 | JB2 | (JB4&(S2|(B5&B4)))
J5 = JB2 | JB3 | (JB4&S345&B5&B4)
J4 = JB1 | JB2 | JB3 | (JB4&(B4&(S2|B5)))
J3 = JB4 & B2
J2 = JB1 | ((JB2|JB3)&B5) | (JB4&B1)
J1 = JB1 | ((JB2|JB3)&B4) | (JB4&B0)
J0 = JB1
KB = B7&B6&B5
KB1 = (B2&B1&B0)|(B2&B1&B0)
KB2 = KB&KB1&(S2|S5)
KB3 = KB&KB1&(S3|S4)
K9 = (KB1&(S2|S3)) | (KB2&S2) | (KB3&S3)
K8 = (KB1&(S2|S4)) | (KB2&S2) | (KB3&S4)
K7 = (KB1&((S345&B4&B0)|(S5&B0))) | (KB2&S5) | (KB3&(B4&B1&(B2|B0)))
KK6 = (KB3&(B4&((B2&B0)|(B2&B0)))
K6 = (KB1&((S2&B4)|(S5&B0&(B3|B4)))) | (KB2&((S2&B4)|S5)) | KK6
K5 = (KB1&(S2|(S5&B4&(B3|B0)))) | (KB3&B4)
K4 = (KB1&(S2|(S345&B4&B0)|(S5&(B4|B0)))) | (KB2&S5&B4) | (KB3&B4)
K3 = (KB1&(S3|S4)&B0) | (KB2&B2) | (KB3&B4&B2)
KK2 = (KB2&B1) | (KB3&((B4&B1)|(B4&B2)))
K2 = (KB1&((S2&B0)|(S345&B4&B0)|((S3|S4)&B4&B0))) | KK2
K1 = (KB1&S5&B4&B3&B0) | (KB2&B0) | (KB3&B4&B0)
K0 = (KB1&(S2|((S3|S4)&(B4|B0))|(S5&B4&(B3|B0)))) | (KB3&B4)
LB = B7&B6&B5
LB1 = (S2|S5)&(LB&B4)
LB2 = (S3|S4)&LB
LB3 = (S2|S5)&(LB&B4)
L9 = (LB2&S3) | (LB3&(S2&(B2|B1)))
L8 = (LB1&S2) | (LB2&S4) | (LB3&(S2&(B2|B1)))
L7 = LB1 | (LB2&(B4&((B3&(B1|B0))|(B3&(B2|(B1&B0)))))) | (LB3&B2)
LL6 = (LB3&(B1|(S2&B2&B1)))
L6 = LB1 | (LB2&((B3&(B1|B0))&(B4|(B4&B2)))|(B4&B3&B1&B0))) | LL6
LL5 = (LB3&(B2&B0&(B1|S5)))
L5 = (LB2&((B4&B2&(B1|B0))|(B3&B2)|((B4|B3)&B1&B0))) | LL5
LL4 = (LB1&B2) | (LB3&((B2&B0)|(B2&B0)))
L4 = LB2&((B4&B2&(B1|B0))|(B4&B3&B2)|(B1&B0&(B4|B3)))) | LL4
L3 = (LB1&B1) | (LB2&B1&B0) | (LB3&B3)
L2 = (LB1&B0) | (LB2&((B1|B2)&B0))
L1 = LB2 | LB3
L0 = LB1 | LB2 | LB3
ZZ9 = (GB&G9) | (HB&H9) | (JB&J9) | (KB&K9) | (LB&L9)
ZZ8 = (GB&G8) | (HB&H8) | (JB&J8) | (KB&K8) | (LB&L8)
ZZ7 = (GB&G7) | (HB&H7) | (JB&J7) | (KB&K7) | (LB&L7)
ZZ6 = (GB&G6) | (HB&H6) | (JB&J6) | (KB&K6) | (LB&L6)
ZZ5 = (GB&G5) | (HB&H5) | (JB&J5) | (KB&K5) | (LB&L5)
ZZ4 = (GB&G4) | (HB&H4) | (JB&J4) | (KB&K4) | (LB&L4)
ZZ3 = (GB&G3) | (HB&H3) | (JB&J3) | (KB&K3) | (LB&L3)
ZZ2 = (GB&G2) | (HB&H2) | (JB&J2) | (KB&K2) | (LB&L2)
ZZ1 = (GB&G1) | (HB&H1) | (JB&J1) | (KB&K1) | (LB&L1)
ZZ0 = (GB&G0) | (HB&H0) | (JB&J0) | (KB&K0) | (LB&L0)
QB = (NH2&NL6&S4) | (NH7&NLB&S3) | (NHC&NL6&S5)
Z9 = (ZZ9&QB) | (QB&B0)
Z8 = (ZZ8&QB) | (QB&B5&B2)
Z7 = (ZZ7&QB) | QB
Z6 = (ZZ6&QB)
Z5 = (ZZ5&QB)
Z4 = (ZZ4&QB)
Z3 = (ZZ3&QB)
Z2 = (ZZ2&QB)
Z1 = (ZZ1&QB)
Z0 = (ZZ0&QB)
T1 = B3&( (B7 | B6 | B5) | ((S2 | S5)&B4) )
T2 = (NH5&NL8) | (NH7&NLB&S3)
```

Figure 5:
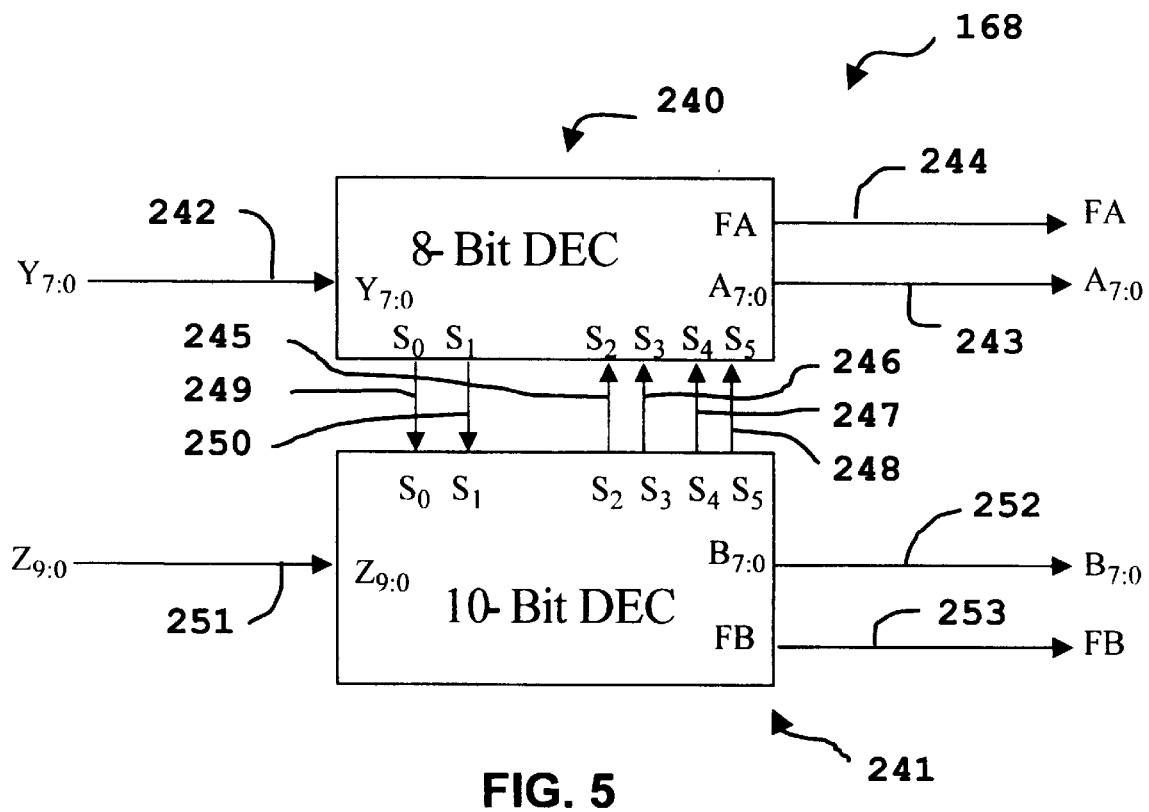
FIG. 5 is a block diagram of a decoder according to one embodiment of the present invention.

FIG. 5 is a block diagram illustrating decoder 168 which, in the above-example, decodes successive code words having alternating code word lengths of eight bits and ten bits into successive data words having eight bits. Decoder 168 includes eight-bit decoder 240 and ten-bit decoder 241. Eight-bit decoder 240 includes eight-bit code word input Y[7:0] which is coupled to bus 242, eight-bit code word output A[7:0] which is coupled to bus 243, invalid code word indicator output FA which is coupled to bus 244, next state pointer inputs $S_2$–$S_5$ which are coupled to buses 245–248, respectively, and next state pointer outputs $S_0$–$S_1$ which are coupled to buses 249 and 250, respectively. Ten-bit decoder 241 includes ten-bit code word input Z[9:0] which is coupled to bus 251, eight-bit code word output B[7:0] which is coupled to bus 252, invalid code word indicator output FB which is coupled to bus 253, next state pointer inputs $S_0$–$S_1$ which are coupled to buses 249 and 250, respectively, and next state pointer outputs $S_2$–$S_5$ which are coupled to buses 245–248, respectively. Incoming code words are time-multiplexed onto code word inputs Y[7:0] and Z[9:0] from serial-to-parallel converter 163 (shown in FIG. 2), and the corresponding decoded data words are time-multiplexed onto data word outputs A[7:0] and B[7:0].

The Boolean equations for eight-bit decoder 240 and ten-bit decoder 241 are provided in Tables 7A and 7B below.

TABLE 7A

EIGHT-BIT DECODER BOOLEAN EQUATIONS:
S0 = Y7
S1 = $\overline{Y7}$
NH1 = $\overline{Y7}$&$\overline{Y6}$&$\overline{Y5}$&Y4
NH2 = $\overline{Y7}$&$\overline{Y6}$&Y5&$\overline{Y4}$
NH3 = $\overline{Y7}$&$\overline{Y6}$&Y5&Y4
NH4 = $\overline{Y7}$&Y6&$\overline{Y5}$&$\overline{Y4}$
NH5 = $\overline{Y7}$&Y6&$\overline{Y5}$&Y4
NH6 = $\overline{Y7}$&Y6&Y5&$\overline{Y4}$
NH7 = $\overline{Y7}$&Y6&Y5&Y4
NH8 = Y7&$\overline{Y6}$&$\overline{Y5}$&$\overline{Y4}$
NH9 = Y7&$\overline{Y6}$&$\overline{Y5}$&Y4
NHA = Y7&$\overline{Y6}$&Y5&$\overline{Y4}$
NHB = Y7&$\overline{Y6}$&Y5&Y4
NHC = Y7&Y6&$\overline{Y5}$&$\overline{Y4}$
NHD = Y7&Y6&$\overline{Y5}$&Y4
NL0 = $\overline{Y3}$&$\overline{Y2}$&$\overline{Y1}$&$\overline{Y0}$
NL3 = $\overline{Y3}$&$\overline{Y2}$&Y1&Y0
NL4 = $\overline{Y3}$&Y2&$\overline{Y1}$&$\overline{Y0}$
NL6 = $\overline{Y3}$&Y2&Y1&$\overline{Y0}$
NL7 = $\overline{Y3}$&Y2&Y1&Y0
NL8 = Y3&$\overline{Y2}$&$\overline{Y1}$&$\overline{Y0}$
NL9 = Y3&$\overline{Y2}$&$\overline{Y1}$&Y0
NLB = Y3&$\overline{Y2}$&Y1&Y0
NLC = Y3&Y2&$\overline{Y1}$&$\overline{Y0}$
P80 = NH8&NL0
PB0 = NHB&NL0
MS4A = NH4|NHA
MS89CD = NH8|NH9|NHC|NHD
MS1256 = NH1|NH2|NH5|NH6
MSGY = MS89CD | MS1256
MSLY = MS4A | MSGY
GY = MSGY&$\overline{Y1}$&Y0
HY = (MS4A&$\overline{Y1}$&Y0) | (MSGY&(NL7|NLB))
JY1 = Y$\underline{3}$&((NHB&((Y1^Y0)|NL4))| (NH3&(Y2|Y1)&$\overline{Y0}$)|(NH7&Y1& Y0))
JY2 = NL3&MSLY&(S4|S5)
JY = JY1 | JY2
KY = (Y7&$\overline{Y6}$&Y5&NL7) | (NHB&NL3) | (NH3&$\overline{Y3}$&(Y2|$\overline{Y1}$)&Y0)
LY = (MSLY & (($\overline{Y3}$|$\overline{Y2}$|$\overline{Y1}$)&Y0) & $\underline{((S5\&NL8)|P80)}$ ) | (PB0&(S2|S3))
G7 = S4|S5
G6 = S3|S5
G5 = 0
G4 = 0
G3 = Y6
G2 = (Y7&Y4)|($\overline{Y7}$&$\overline{Y4}$)
G1 = Y3
G0 = Y2
H7 = (S4|S5)&((Y7&Y5)|($\overline{Y7}$&$\overline{Y5}$&$\overline{Y4}$)|NLB)
H6 = S3|S5
H5 = 1
H4 = 1
H3 = 1
H2 = Y1

TABLE 7A-continued

H1 = ($\underline{Y1}$&Y3) | (Y6&Y1)
H0 = ($\underline{Y1}$&Y2) | (((Y7&Y4)|($\overline{Y7}$&Y5))&Y1)
J7 = (S4|S5)
J6 = S5 | (S3&JY1)
J5 = (JY1&((Y7&Y2)|Y6|($\overline{Y7}$&$\underline{Y1}$))) | (JY2&(Y6|(Y7&Y5)))
J4 = (JY1&((Y7&($\underline{Y2}$|($\underline{Y1}$&$\underline{Y0}$))|($\overline{Y7}$&Y6))) | (JY2&($\underline{Y6}$|($\overline{Y7}$&$\underline{Y5}$&$\underline{Y4}$)))
J3 = (JY1&((Y7&Y1)|($\overline{Y7}$&Y2&Y1))) | (JY2&((Y7&Y4)|($\overline{Y7}$&Y5)))
J2 = JY1
J1 = JY1
J0 = JY1
K7 = 1
K6 = 1
K5 = S5 | $\underline{Y2}$
K4 = S4 | $\underline{Y2}$
K3 = Y4 & Y2 & Y1
K2 = 1
K1 = 0
K0 = 0
L7 = S5 | S4
L6 = S5 | S3
L5 = Y6 | (Y7 & Y5 & $\underline{Y4}$)
L4 = $\underline{Y6}$ | ($\overline{Y7}$ & Y5 & $\underline{Y4}$)
L3 = (Y7 & $\underline{Y5}$ & Y4) | ($\overline{Y7}$ & Y5)
L2 = Y3
L1 = Y2
L0 = Y1
AA7 = (GY&G7) | (HY&H7) | (JY&J7) | (KY&K7) | (LY&L7)
AA6 = (GY&G6) | (HY&H6) | (JY&J6) | (KY&K6) | (LY&L6)
AA5 = (GY&G5) | (HY&H5) | (JY&J5) | (KY&K5) | (LY&L5)
AA4 = (GY&G4) | (HY&H4) | (JY&J4) | (KY&K4) | (LY&L4)
AA3 = (GY&G3) | (HY&H3) | (JY&J3) | (KY&K3) | (LY&L3)
AA2 = (GY&G2) | (HY&H2) | (JY&J2) | (KY&K2) | (LY&L2)
AA1 = (GY&G1) | (HY&H1) | (JY&J1) | (KY&K1) | (LY&L1)
AA0 = (GY&G0) | (HY&H0) | (JY&J0) | (KY&K0) | (LY&L0)
QY = (P80 & S3) | ((NHA|NH4) & NLB & S4)
A7 = (AA7 & $\underline{QY}$) | (QY & Y6)
A6 = (AA6 & $\underline{QY}$) | (QY & $\underline{Y3}$)
A5 = (AA5 & $\underline{QY}$) | (QY & Y3)
A4 = (AA4 & $\underline{QY}$)
A3 = (AA3 & $\underline{QY}$) | (QY & Y6)
A2 = (AA2 & $\underline{QY}$) | (QY & Y7)
A1 = (AA1 & $\underline{QY}$) | (QY)
A0 = (AA0 & $\underline{QY}$) | (QY & Y6)
RY = (NHC & NLC & S2) | (NH9 & NL9 & S3) | (NH6 & NL6 & S4)
FA = $\underline{(GY|HY|JY|KY|LY|QY)}$ | RY

TABLE 7B

TEN-BIT DECODER BOOLEAN EQUATIONS:
S2 = (Z9 & Z8) | ((Z9 | Z8) & Z7 & Z6)
S3 = (Z9 & $\underline{Z8}$) & ($\underline{Z7}$ | $\underline{Z6}$)
S4 = ($\underline{Z9}$ & Z8) & ($\underline{Z7}$ | $\underline{Z6}$)
S5 = $\underline{Z9}$ & $\underline{Z8}$
NH0 = $\underline{Z7}$&$\underline{Z6}$&$\underline{Z5}$&$\underline{Z4}$
NH1 = $\underline{Z7}$&$\underline{Z6}$&$\underline{Z5}$&Z4
NH2 = $\underline{Z7}$&$\underline{Z6}$&Z5&$\underline{Z4}$ TABLE 7B-continued

```
NH3  = Z7&Z6&Z5&Z4
NH4  = Z7&Z6&Z5&Z4
NH5  = Z7&Z6&Z5&Z4
NH6  = Z7&Z6&Z5&Z4
NH7  = Z7&Z6&Z5&Z4
NH8  = Z7&Z6&Z5&Z4
NH9  = Z7&Z6&Z5&Z4
NHA  = Z7&Z6&Z5&Z4
NHB  = Z7&Z6&Z5&Z4
NHC  = Z7&Z6&Z5&Z4
NHD  = Z7&Z6&Z5&Z4
NL0  = Z3&Z2&Z1&Z0
NL1  = Z3&Z2&Z1&Z0
NL3  = Z3&Z2&Z1&Z0
NL5  = Z3&Z2&Z1&Z0
NL6  = Z3&Z2&Z1&Z0
NL7  = Z3&Z2&Z1&Z0
NL9  = Z3&Z2&Z1&Z0
NLB  = Z3&Z2&Z1&Z0
NLC  = Z3&Z2&Z1&Z0
PP0  = Z9&Z8
PP1  = Z9&Z8
PP2  = Z9&Z8
PP3  = Z9&Z8
PP21 = PP2|PP1
LS15 = NL1|NL5
LS37 = NL3|NL7
LS37B = LS37|NLB
MS37 = NH3|NH7
MS37B = MS37| NHB
MS037B = MS37B| NH0
MS4A = NH4|NHA
MS89 = NH8|NH9
MSCD = NHC|NHD
MS12 = NH1|NH2
MS1245 = MS12|NH4|NH5
MS1256 = MS12|NH5|NH6
MSS2 = PP21&(Z7&Z6&Z5)
NBE = (((Z3^Z2)|(Z2^Z1))&Z0)
GZ1 = MS1256
GZ2 = (PP3&Z7&Z5&Z4) | (PP2&MSCD)
GZ3 = PP3&(MS89|MS4A)
GZ = (GZ1|GZ2|GZ3) & (Z1&Z0)
G7 = 0
G6 = 0
G5 = GZ2|GZ3
G4 = (GZ1&Z6) | (GZ2&Z7) | (GZ3&(Z6|Z5))
G3 = S1
G2 = (GZ1&Z5) | (GZ2&((Z8&Z6)|(Z7&Z4))) | (GZ3&(Z5|Z4))
G1 = Z3
G0 = Z2
HZ1 = (NH4&NL0&S0) | (((PP0&NH0)|(PP0&NHA))&NLB)
HZ2 = (NH3&Z3&Z0)
HZ3 = (MS1256&(Z3|Z2|Z1)&Z0) & (Z4|NL0|S1)
HZ = HZ1|HZ2|HZ3
H7 = 0
H6 = 1
H5 = (HZ1&Z3) | (HZ2&Z2) | (HZ3&Z6)
H4 = HZ1 | (HZ2&Z1) | (HZ3&Z4)
H3 = HZ1 | S1
H2 = HZ2 | (HZ3&Z3)
H1 = HZ2 | (HZ3&Z2)
H0 = HZ2 | (HZ3&Z1)
JZ1 = MSS2&(NL0|(Z4&NL7&S1))
JZ2 = (NH7|((Z9|Z8)&NHB)) & (Z3&Z0)
JZ3 = NBE & (GZ3|MSS2)
JZ = JZ1|JZ2|JZ3
J7 = 1
J6 = 0
J5 = (JZ1&Z9) | (JZ2&Z2) | (JZ3&((MSS2&Z9)|(MS4A)))
J4 = (JZ1&Z4&Z0) | (JZ2&Z1) | (JZ3&(Z5|Z4))
J3 = S1&(JZ1|JZ2|JZ3)
J2 = (JZ2&Z6) | (JZ3&Z3)
J1 = (JZ2&Z6) | (JZ3&Z2)
J0 = (JZ2&Z6) | (JZ3&Z1)
KZ1 = (PP3&MS37&LS15) | (PP21&NH0&(Z3|Z2)&Z1&Z0) |(PP3&NH9&NL0)
KZ2 = NBE& ((PP3&(NH0|NH4))|(PP0&MSCD))
KZ3 = PP21 & ((NH0&NBE)|(MS37B&LS15))
KZ4 = PP0 & ((Z7&Z6&Z5&NL0)|(NHA&NL3)|(NH3&NL5))
```

TABLE 7B-continued

```
KZ195 = (KZ1&(NH9|NL5))
KZ = KZ1|KZ2|KZ3|KZ4
K7 = 1
K6 = 1
K5 = 0
K4 = (KZ1&(Z6|Z7|(Z3&Z2))) | (KZ2&(Z4|NH4)) | (KZ3&Z4) | (KZ4&Z6&Z4)
K3 = S1&(KZ1|KZ2|KZ3|KZ4)
K2 = KZ195 | (KZ2&Z3) | (KZ3&(Z3|(Z4&Z2))) | (KZ4&Z2)
K1 = KZ195 | ((KZ2|KZ4)&Z2) | (KZ3&((Z4&Z2)|Z7|(Z6&Z2)))
K0 = KZ195 | (KZ2&Z1) | (KZ3&(Z1|(Z4&(Z6^Z2)))) | (KZ4&Z2)
LZ1 = (Z9&Z7&Z6&Z5)&(Z1&Z0)
LZ2 = PP21 & ((MS1256|MS89|MS4A)&LS37B)
LZ3 = PP21 & (MS037B&LS37)
LZ4 = ((PP3&MS1245)|MSS2|(PP0&(MS1256|MS89|MSCD))) & (Z2&Z1&Z0)
LZ = LZ1|LZ2|LZ3|LZ4
L7 = 1
L6 = 1
L5 = 1
L4 = (LZ2&(Z7|NH4)) | (LZ3&(Z7|Z6)) | LZ4
L3 = (LZ1&S1) | (LZ2&(Z6|NHA)) | (LZ3&Z6&Z5) | (LZ4&Z3)
L2 = (LZ1&Z4) | (LZ2&(Z5|NH9)) | (LZ3&Z2) | (LZ4&Z7)
L1 = ((LZ1|LZ2)&Z3) | LZ3 | (LZ4&Z6&(Z9|Z8))
L0 = ((LZ1|LZ2)&Z2) | LZ3 | (LZ4&((Z7&Z4)|(Z7&Z4)))
BB7 = (GZ&G7) | (HZ&H7) | (JZ&J7) | (KZ&K7) | (LZ&L7)
BB6 = (GZ&G6) | (HZ&H6) | (JZ&J6) | (KZ&K6) | (LZ&L6)
BB5 = (GZ&G5) | (HZ&H5) | (JZ&J5) | (KZ&K5) | (LZ&L5)
BB4 = (GZ&G4) | (HZ&H4) | (JZ&J4) | (KZ&K4) | (LZ&L4)
BB3 = (GZ&G3) | (HZ&H3) | (JZ&J3) | (KZ&K3) | (LZ&L3)
BB2 = (GZ&G2) | (HZ&H2) | (JZ&J2) | (KZ&K2) | (LZ&L2)
BB1 = (GZ&G1) | (HZ&H1) | (JZ&J1) | (KZ&K1) | (LZ&L1)
BB0 = (GZ&G0) | (HZ&H0) | (JZ&J0) | (KZ&K0) | (LZ&L0)
QZ = (Z9 | Z8)&(NH8&NL0)&S0
B7 = (BB7&QZ) | (QZ&Z9&Z8)
B6 = (BB6&QZ) | (QZ&Z8)
B5 = (BB5&QZ) | (QZ&(Z9|Z8))
B4 = (BB4&QZ) | (QZ&Z9)
B3 = (BB3&QZ) | (QZ&Z9)
B2 = (BB2&QZ) | (QZ&Z9)
B1 = (BB1&QZ) | (QZ)
B0 = (BB0&QZ) | (QZ&Z9)
RZ = (PP1&NH9&NL9&S0) | (PP2&NH6&NL6&S1) | (PP0&NHC&NLC&S0) | (PP0&NHC&NL0&S1)
FB = (GZ|HZ|JZ|KZ|LZ|QZ) | RZ
```

The coding structure of the present invention can be expanded above the above-example to generate code words having a variety of alternating code word lengths and a variety of MTR constraints beginning at different predefined locations within individual code words. However, it is important that the alternating code word lengths and the MTR location dependency be defined such that corresponding bit locations in successive code words have the same MTR constraint and all MTR constraints are satisfied when the code words are concatenated to one another to form the code word stream.

This expansion can be defined in terms of variables, including code word length variables "Y" and "Z", MTR constraint variables "M" and "N", and an MTR location dependency variable "S". These variables are shown in FIG. 6 with reference to code word stream 178. Again, bit location line 184 is shown above code word stream 178. Code words 180–182 have alternating first and second code word lengths of "Y" bit locations (labeled 260) and "Z" bit locations (labeled 262), respectively. In the example shown in FIG. 6, Y=8 for code words 180 and 182, and Z=10 for code word 181. Encoder 150 imposes a first MTR constraint of "M" on a first set of the Y and Z bit locations, as shown by MTR constraint line 264. Each bit location in the first set is spaced "S" bit locations (labeled 266) apart from one another. In FIG. 6, S=2. Therefore, bit locations "7", "5", "3" and "1" in code words 180 and 182 each have an MTR constraint of M and are spaced two bit locations apart from one another (e.g. 7−5=2). Likewise, bit locations "9", "7", "5", "3" and "1" in code word 181 each have an MTR constraint of M and are spaced two bit locations apart from one another. The code word length variables Y (260) and Z (262) are preferably evenly divisible by the MTR location dependency variable S (266). In the example shown, Y=8 and Z=10, which are both evenly divisible by S, which is equal to two. The encoder imposes a second MTR constraint of "N", which is different than "M", on a second set of the Y and Z bit locations. The second set comprises each of the Y and Z bit locations that are not in the first set. For example, M may be equal to two and N may be equal to three.

In an alternative embodiment, the MTR location dependency variable S equals three. Therefore, every third bit location has an MTR constraint of M, and all remaining bit locations have an MTR constraint of N. For eight-bit data words, possible alternating code word lengths include nine and twelve, for example, since these lengths are evenly divisible by three.

In summary, the present invention provides an encoder 150 and a method of encoding successive data words 152 for transmission through a channel 160. The successive data words 152 are encoded into successive code words 153, 180, 181, 182 having alternating code word lengths Y (260) and Z (262). Each code word has a plurality of bit locations, such as Y[7:0] and Z[9:0]. A first MTR constraint of M is imposed on a first set of the bit locations, wherein each bit location in the first set is spaced S (266) bit locations apart from one another. S is an integer greater than 1. A second MTR constraint of N, which is different than the first MTR constraint, is imposed on a second set of the bit locations, wherein the second set comprises each of the bit locations that are not in the first set. The alternating code word lengths Y and Z and the value of S are defined such that corresponding bit locations in successive code words have the same maximum transition run constraint.

In one embodiment of the present invention, the method of encoding includes defining the alternating code word lengths Y and Z such that they are evenly divisible by S. For example, the method can define S=2 such that the first set of bit locations includes every other one of the plurality of bit locations. A maximum transition run constraint of three is imposed on the first set of the bit locations, such as every even bit location, and a maximum transition run constraint of two is imposed on the second set of the bit locations, such as every odd bit position, as shown in line 190 of FIG. 3. Successive data words 152 are encoded alternately into eight-bit code words 180 and 182 and ten-bit code words 181.

In one aspect of the invention, each code word 153, 180–182 is formed of a series of code symbols, such as binary "1's" and "0's", and the method of encoding further includes concatenating the successive code words together to form a serial code word stream 178. The number of consecutive bit locations in the serial code stream 178 that have identical code symbols is limited to a maximum of seven.

Another aspect of the present invention relates to a encoder 150 for encoding data words 152 into respective code words 153, 180–182. Encoder 150 includes a data word input A[7:0] and B[7:0] for receiving data words 152, a code word output Y[7:0] and Z[9:0] and a state machine 220, 221. The state machine includes a sequence of states which encodes successive data words 152 received on the data word input A[7:0] and B[7:0] into code words 153, 180–182 having alternating code word lengths Y and Z on the code word output Y[7:0] and Z[9:0]. Each code word 153, 180–182 has a plurality of bit locations. The sequence of states is arranged to impose a first MTR constraint of M on a first set of the plurality of bit locations. Each bit location in the first set is spaced S bit locations apart from one another, where S is an integer greater than one. The sequence of states is arranged to impose a second MTR constraint of N, which is different than the first MTR constraint, on a second set of the plurality of bit locations which comprises each of the bit locations that are not in the first set. The alternating code word lengths Y and Z and the value of S are defined by the state machine such that corresponding bit locations in successive code words 153, 180–181 have the same MTR constraint.

Another aspect of the present invention relates to a decoder 168 having a code word input 166, 242, 251, a data word output 170, 243, 252 and a state machine 241, 241. The state machine 240, 241 has a sequence of states which is arranged to decode successive code words into successive data words having a fixed data word length. The successive code words have alternating code word lengths 260 and 262, and each successive code word has a plurality of bit locations. Each code word has a first maximum transition run constraint M on a first set of the plurality of bit locations. Each bit location in the first set is spaced S bit locations apart from one another, with S being an integer greater than one. Each code word has a second maximum transition run constraint N, which is different than the first maximum transition run constraint, on a second set of the plurality of bit locations which include each of the bit locations that are not in the first set. The alternating code word lengths and the value of S are defined such that corresponding bit locations in successive code words have the same maximum transition run constraint. The sequence of states is arranged to apply the successive data words on the data word output 170, 243, 252.

Yet another aspect of the present invention relates to a method of decoding a code word stream 166 received from a storage channel. Successive code words from the code word stream 166 are decoded into a data word 170, 243, 252 having a fixed data word length. The successive code words have alternating first and second code word lengths 260 and 262 which are different from one another. Each each code word has a plurality of bit locations. A first maximum transition run constraint M is applied on a first set of the bit locations. Each bit location in the first set is spaced S bit locations apart from one another. S is an integer greater than one. A second maximum transition run constraint N, which is different than the first maximum transition run constraint M, is applied on a second set of the bit locations, wherein the second set includes each of the bit locations that are not in the first set. The value of S relative to the alternating code word lengths 260 and 262 is defined such that corresponding bit locations in successive code words have the same maximum transition run contraint.

In yet another aspect of the present invention, a disc drive storage channel 148 is provided which includes a transducer 112 capable of communicating with a data storage disc 106 and means for encoding data words 152 into code words 153, 180–182 which successively alternate between a first code word length Y and a second code word length Z and for imposing the constraints discussed above.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the coding method and apparatus while maintaining substantially the same functionality without departing from the scope and spirit of the present invention. In addition, although the preferred embodiment described herein is directed to a coding system for a disc drive, it will be appreciated by those skilled in the art that the teachings of the present invention can be applied to other systems, like satellite communications or cellular phone systems, without departing from the scope and spirit of the present invention.

What is claimed is:

1. A method of encoding successive data words for transmission through a channel, comprising steps of:
   (a) encoding successive data words into successive code words having alternating code word lengths, each code word having a plurality of bit locations;
   (b) imposing a first maximum transition run constraint on a first set of the bit locations, wherein each bit location in the first set is spaced S bit locations apart from one another with S being an integer greater than 1;
   (c) imposing a second maximum transition run constraint, which is different than the first maximum transition run constraint, on a second set of the bit locations, wherein the second set comprises each of the bit locations that are not in the first set; and (d) defining the alternating code word lengths and the value of S such that corresponding bit locations in successive code words have the same maximum transition run constraint.

2. The method of claim 1 wherein defining step (d) comprises defining the alternating code word lengths and the value of S such that the alternating code word lengths are evenly divisible by S.

3. The method of claim 1 and further comprising a step (e) of defining S=2 such that the first set of bit locations includes every other one of the plurality of bit locations, and wherein imposing step (b) comprises imposing a maximum transition run constraint of three on the first set of the bit locations; and wherein imposing step (c) comprises imposing a maximum transition run constraint of two on the second set of the bit locations.

4. The method of claim 3 wherein the plurality of bit locations comprises even bit locations and odd bit locations and wherein imposing step (b) comprises imposing a maximum transition run constraint of three on the even bit locations, and wherein imposing step (c) comprises imposing a maximum transition run constraint of two on the odd bit locations.

5. The method of claim 1 wherein each data word has eight bit locations and wherein encoding step (a) comprises encoding the successive data words alternately into eight-bit code words and ten-bit code words.

6. The method of claim 1 wherein each code word is formed of a series of code symbols and wherein the method further comprises steps:

(e) concatenating the successive code words together to form a serial code word stream; and (f) limiting the number of consecutive bit locations in the serial code stream that have identical code symbols to a maximum of seven.

7. An encoder for encoding data words into respective code words, the encoder comprising:

a data word input for receiving data words;

a code word output; and a state machine comprising a sequence of states which encodes successive data words received on the data word input into code words having alternating code word lengths on the code word output, wherein: (i) each code word has a plurality of bit locations; (ii) the sequence of states is arranged to impose a first maximum transition run constraint on a first set of the plurality of bit locations with each bit location in the first set being spaced S bit locations apart from one another, and with S being an integer greater than 1; (iii) the sequence of states is arranged to impose a second maximum transition run constraint, which is different than the first maximum transition run constraint, on a second set of the plurality of bit locations which comprises each of the bit locations that are not in the first set; and (iv) the alternating code word lengths and the value of S are defined by the state machine such that corresponding bit locations in successive code words have the same maximum transition run constraint.

8. The encoder of claim 7 wherein the alternating code word lengths are evenly divisible by S.

9. The encoder of claim 8 wherein:

S is defined as being equal to two;

the first set of bit locations comprises every other one of the plurality of bit locations;

the sequence of states imposes a maximum transition run constraint of three on each of the bit locations in the first set; and the sequence of states imposes a maximum transition run constraint of two on each of the bit locations in the second set.

10. The encoder of claim 9 wherein the plurality of bit locations comprises even bit locations and odd bit locations and wherein:

the sequence of states imposes a maximum transition run constraint of three on the even bit locations; and the sequence of states imposes a maximum transition run constraint of two on the odd bit locations.

11. The encoder of claim 9 wherein each data word has eight bit locations and wherein the sequence of states is arranged to encode the successive data words alternately into eight-bit code words and ten-bit code words.

12. A decoder comprising:

a code word input;

a data word output; and a state machine comprising a sequence of states which is arranged to decode successive code words into successive data words having a fixed data word length, wherein: (i) the successive code words have alternating code word lengths, each with a plurality of bit locations; (ii) each code word has a first maximum transition run constraint on a first set of the plurality of bit locations; (iii) each bit location in the first set is spaced S bit locations apart from one another, with S being an integer greater than 1; (iv) each code word has a second maximum transition run constraint, which is different than the first maximum transition run constraint, on a second set of the plurality of bit locations which comprises each of the bit locations that are not in the first set; (v) the alternating code word lengths and the value of S are defined such that corresponding bit locations in successive code words have the same maximum transition run constraint; and (vi) the sequence of states is arranged to apply the successive data words on the data word output.

13. A method of decoding a code word stream received from a storage channel, comprising steps of:

(a) decoding successive code words from the code word stream into a data word having a fixed data word length, wherein the successive code words have alternating first and second code word lengths which are different from one another and wherein each each code word has a plurality of bit locations;

(b) applying a first maximum transition run constraint on a first set of the bit locations, wherein each bit location in the first set is spaced S bit locations apart from one another with S being an integer greater than one;

(c) applying a second maximum transition run constraint, which is different than the first maximum transition run constraint, on a second set of the bit locations, wherein the second set comprises each of the bit locations that are not in the first set; and (d) defining the value of S relative to the alternating code word lengths such that corresponding bit locations in successive code words have the same maximum transition run contraint.

14. The method of claim 13 wherein defining step (d) comprises defining the value of S such that the alternating code word lengths are evenly divisible by S.

15. A disc drive storage channel comprising:

a transducer capable of communicating with a data storage disc; and means for receiving successive data words and encoding the data words into code words which successively alternate between a first code word length and a second code word length and for imposing a first transition run constraint on a first set of bit locations in the code words and a second transition run constraint on a second, different set of bit locations in the code words, wherein corresponding bit positions in the successive code words have the same maximum transition run constraint.

16. The disc drive storage channel of claim 15 wherein:

each of the code words is formed of a series of code symbols, one code symbol per bit position;

the code words form a serial code word stream when concatenated with one another; and the means for encoding comprises means for limiting the number of consecutive bit locations that have identical code symbols to a maximum of seven.

* * * * *

UNITED STATES PATENT AND TRADEMARK OFFICE
CERTIFICATE OF CORRECTION

PATENT NO.   : 6,011,497
DATED        : January 4, 2000
INVENTOR(S)  : Kinhing P. Tsang et al.

It is certified that error appears in the above-identified patent and that said Letters Patent is hereby corrected as shown below:

Col. 6, line 50, delete "29C" second occurrence.

Signed and Sealed this

Twentieth Day of March, 2001

Attest:

NICHOLAS P. GODICI

*Attesting Officer*     *Acting Director of the United States Patent and Trademark Office*